United States Patent
Kawabata et al.

(10) Patent No.: US 10,490,678 B2
(45) Date of Patent: Nov. 26, 2019

(54) PHOTOELECTRIC CONVERSION ELEMENT AND IMAGING SYSTEM

(71) Applicant: CANON KABUSHIKI KAISHA, Tokyo (JP)

(72) Inventors: Kazunari Kawabata, Mitaka (JP); Yusuke Onuki, Fujisawa (JP); Koki Takami, Sagamihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/848,696

(22) Filed: Dec. 20, 2017

(65) Prior Publication Data

US 2018/0182904 A1    Jun. 28, 2018

(30) Foreign Application Priority Data

Dec. 27, 2016 (JP) .................... 2016-254361

(51) Int. Cl.
*H01L 27/146* (2006.01)
*H01L 31/0232* (2014.01)
*H01L 31/103* (2006.01)

(52) U.S. Cl.
CPC .... *H01L 31/0232* (2013.01); *H01L 27/14627* (2013.01); *H01L 27/14643* (2013.01); *H01L 31/02327* (2013.01); *H01L 31/103* (2013.01)

(58) Field of Classification Search
CPC ......... H01L 27/14627; H01L 27/14625; H01L 27/14643; H01L 27/14685; H01L 31/0232; H04N 5/23212
See application file for complete search history.

(56) References Cited

U.S. PATENT DOCUMENTS

| | | | | |
|---|---|---|---|---|
| 2007/0275496 A1* | 11/2007 | Yamashita | ........ | H01L 27/14625 438/57 |
| 2010/0302803 A1* | 12/2010 | Bita | ........ | G02B 6/0036 362/606 |
| 2011/0102651 A1* | 5/2011 | Tay | ........ | H01L 27/14625 348/280 |
| 2012/0038814 A1* | 2/2012 | Tayanaka | ........ | H01L 27/14629 348/340 |
| 2015/0349007 A1* | 12/2015 | Kato | ........ | H01L 27/14609 250/208.1 |
| 2015/0349011 A1* | 12/2015 | Kato | ........ | H01L 27/14625 250/201.4 |
| 2016/0035921 A1* | 2/2016 | Matsuda | ........ | H01L 27/14645 348/374 |
| 2017/0180628 A1* | 6/2017 | Kato | ........ | H04N 5/23212 |

FOREIGN PATENT DOCUMENTS

| | | |
|---|---|---|
| JP | 2007095792 A | 4/2007 |
| JP | 2010287636 A | 12/2010 |
| JP | 2013165297 A | 8/2013 |

* cited by examiner

*Primary Examiner* — Jaehwan Oh
(74) *Attorney, Agent, or Firm* — Canon U.S.A., Inc. IP Division

(57) ABSTRACT

A photoelectric conversion element includes a light guiding unit in which, on each of a first plane, a second plane, and a third plane, a first part of the light guiding unit and a second part of the light guiding unit, which is surrounded by the first part and a refractive index of which is lower than that of the first part, are included, a width of the second part on the first plane is a first length, the width of the second part on the second plane is a second length, and the width of the second part on the third plane is a third length, and the second length is shorter than each of the first length and the third length.

19 Claims, 19 Drawing Sheets

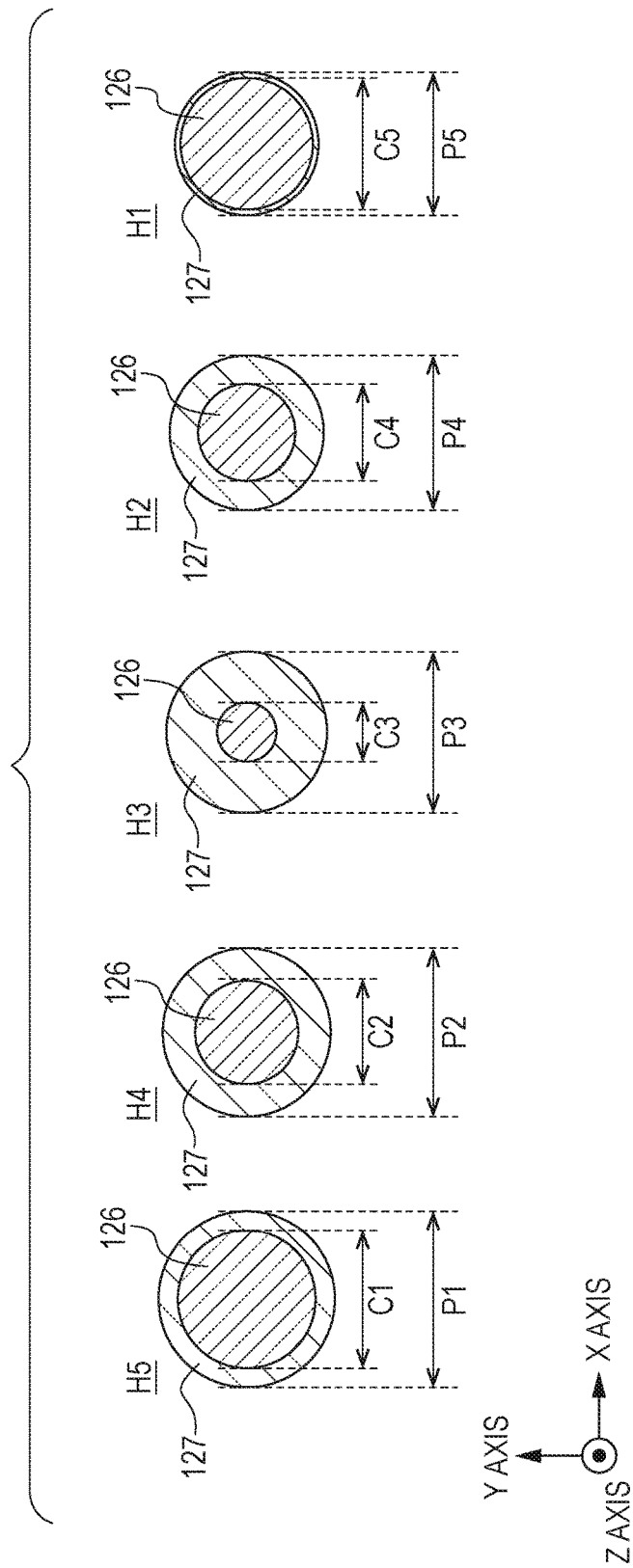

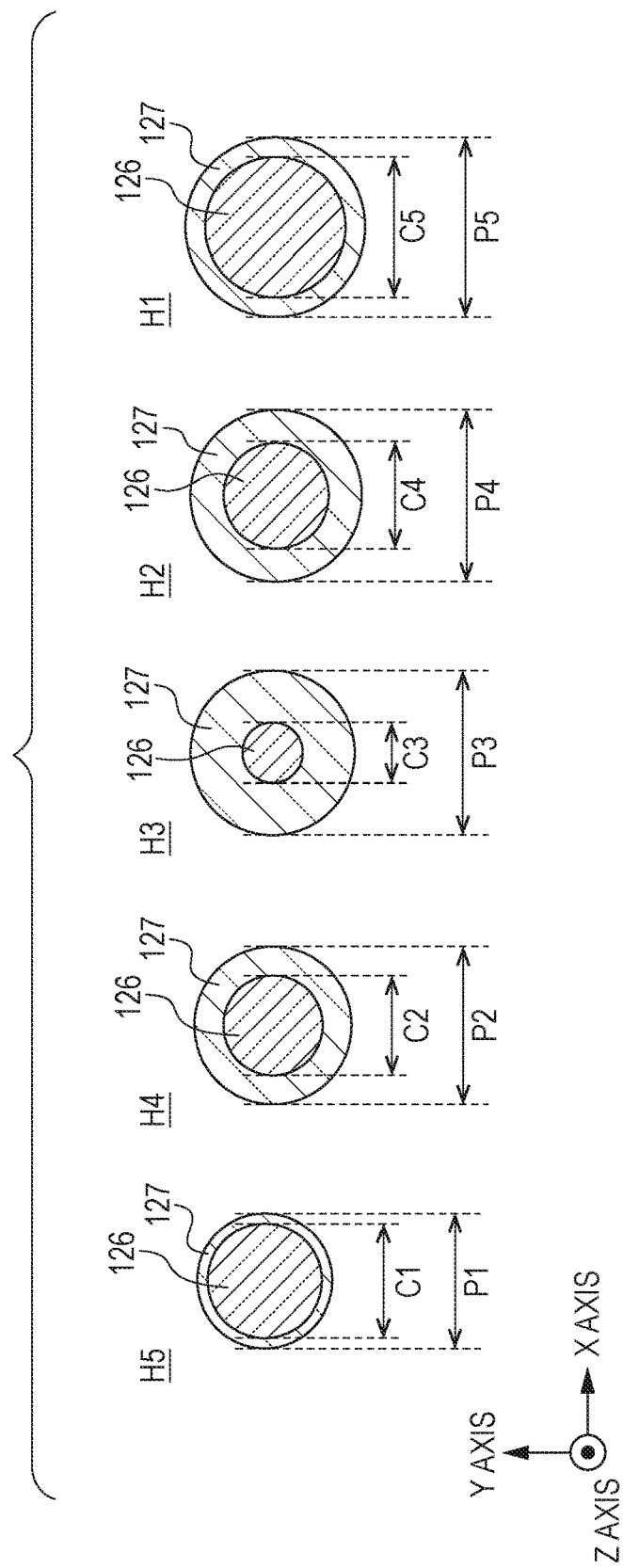

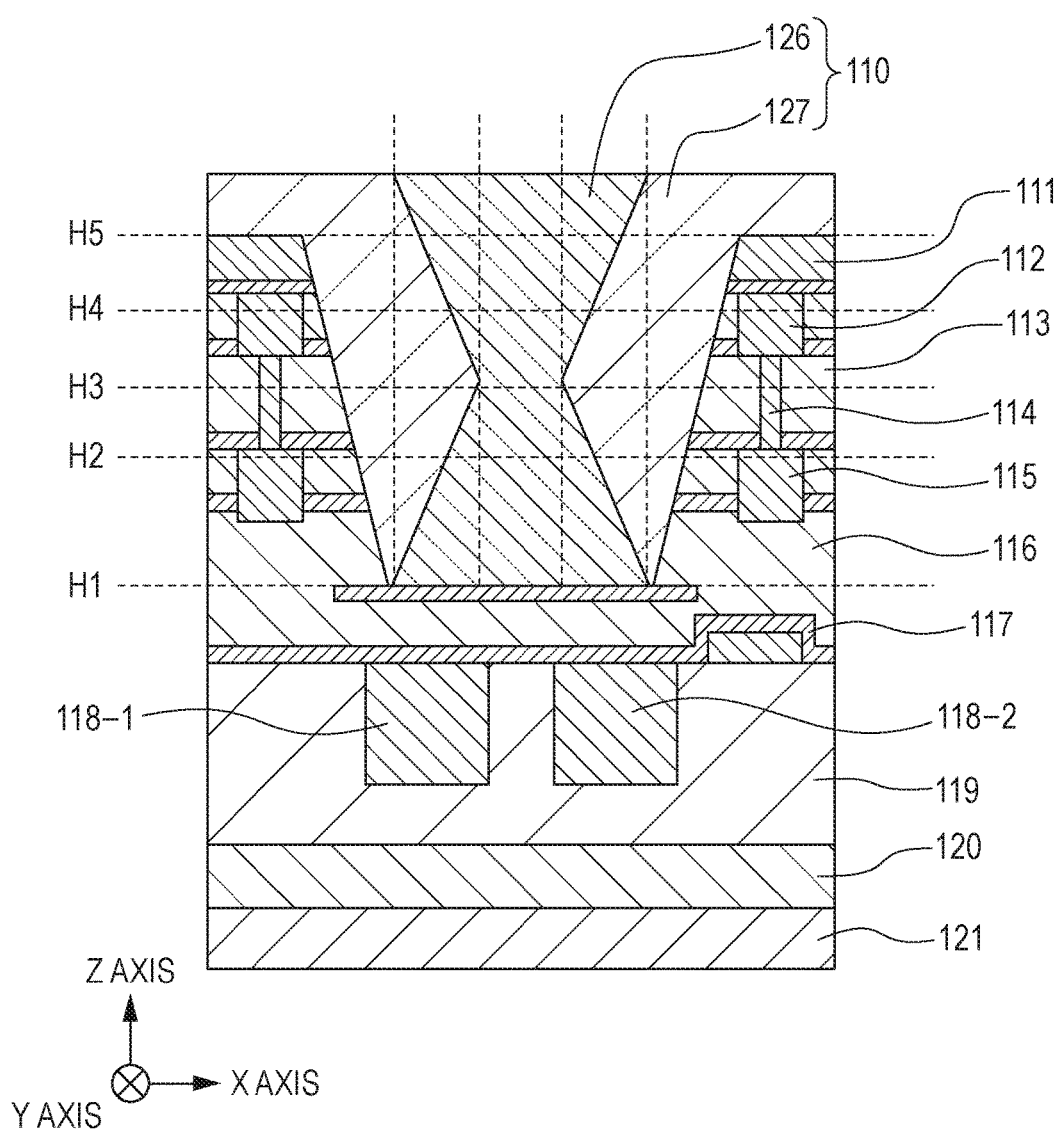

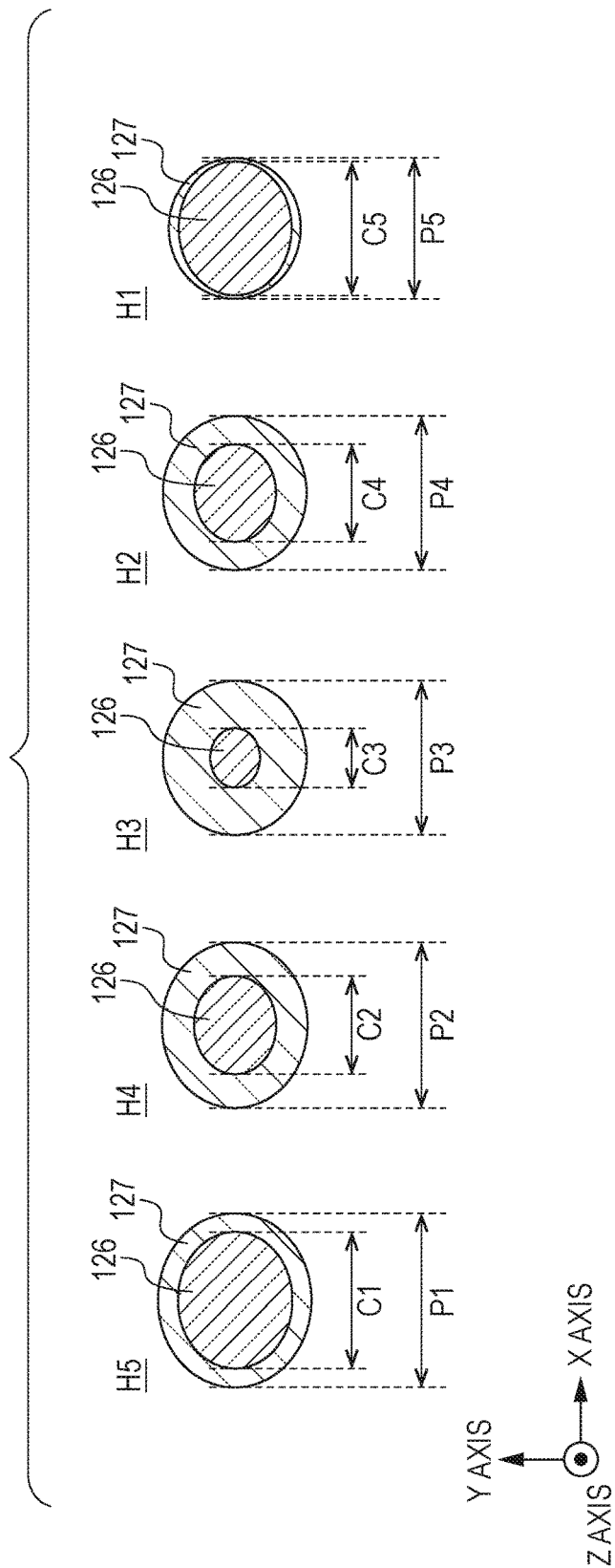

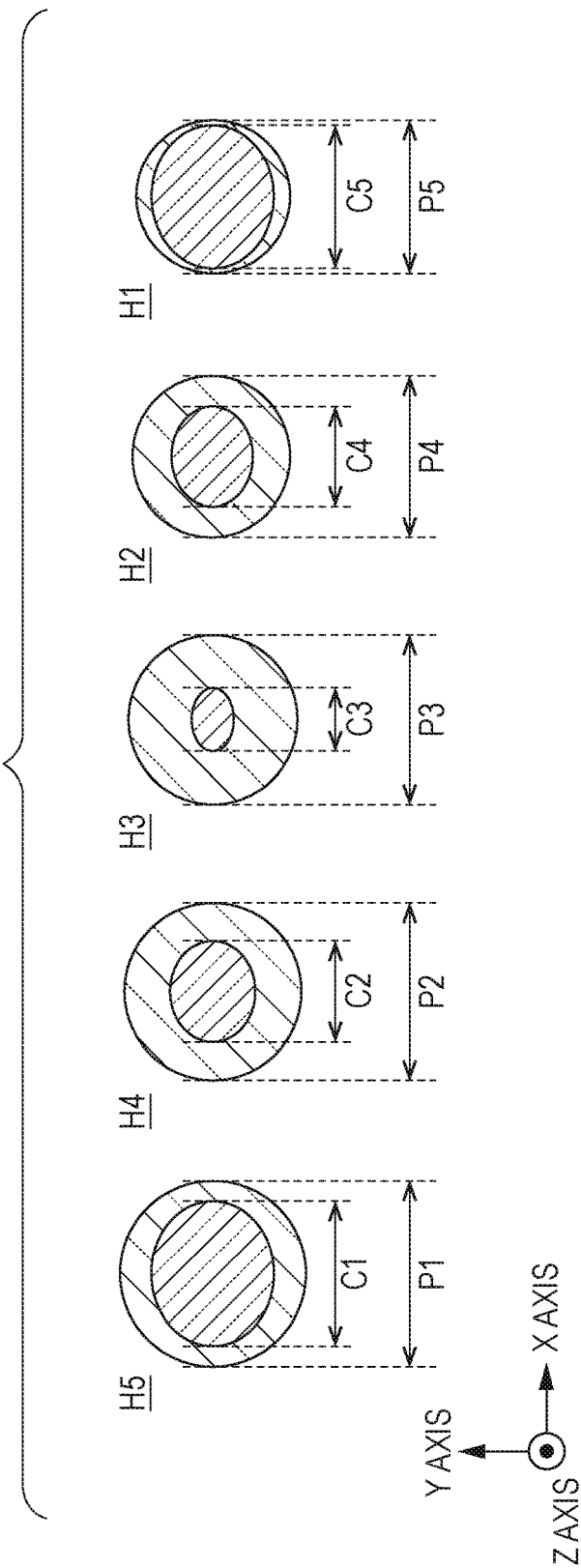

PHOTOELECTRIC CONVERSION ELEMENT AND IMAGING SYSTEM

BACKGROUND

Field of the Disclosure

The present disclosure relates to a photoelectric conversion element and an imaging system.

Description of the Related Art

A photoelectric conversion element including a light guiding unit that guides incident light to a photoelectric conversion unit has been known.

In Japanese Patent Laid-Open No. 2013-165297, a photoelectric conversion element including a light guiding unit that has a structure in which, in an inside of the light guiding unit, a refractive index of an inner side is set to be lower than a refractive index of an outer side is described.

SUMMARY

One aspect of the present disclosure is a photoelectric conversion element, including: a photoelectric conversion unit; and a light guiding unit that is provided above the photoelectric conversion unit, in which a first plane parallel to a light receiving surface of the photoelectric conversion unit, a second plane that is a plane parallel to the light receiving surface of the photoelectric conversion unit and is closer to the light receiving surface than the first plane, and a third plane that is a plane parallel to the light receiving surface of the photoelectric conversion unit and is closer to the light receiving surface than the second plane are included, on each of the first plane, the second plane, and the third plane, a first part of the light guiding unit and a second part of the light guiding unit, which is surrounded by the first part and a refractive index of which is lower than that of the first part, are included, a width of the second part on the first plane is a first length, the width of the second part on the second plane is a second length, the width of the second part on the third plane is a third length, and the second length is shorter than each of the first length and the third length.

Further features of the present disclosure will become apparent from the following description of exemplary embodiments with reference to the attached drawings.

BRIEF DESCRIPTION OF THE DRAWINGS

FIG. 4B illustrates top views of the light guiding unit, both according to one or more embodiment(s) of the present disclosure.

FIG. 6B illustrates top views of a light guiding unit, both according to one or more embodiment(s) of the present disclosure.

FIG. 8A illustrates a sectional structure of the pixel, and FIG. 8B illustrates top views of a light guiding unit, both according to one or more embodiment(s) of the present disclosure.

FIG. 11B illustrates top views of a light guiding unit, both according to one or more embodiment(s) of the present disclosure.

DESCRIPTION OF THE EMBODIMENTS

In the structure of the light guiding unit described in Japanese Patent Laid-Open No. 2013-165297, reduction in light that leaks out from the light guiding unit to an outside of the light guiding unit has not been examined enough.

Hereinafter, aphotoelectric conversion element including a light guiding unit that is able to reduce light leaking out from the light guiding unit to an outside of the light guiding unit and guide light to a photoelectric conversion unit more efficiently will be described.

Exemplary embodiments of the disclosure will be described below by using drawings. Needless to say, the exemplary embodiments according to the disclosure are not limited only to the exemplary embodiments described below. For example, an example in which a part of a configuration in any of the exemplary embodiments below is added to any other exemplary embodiment and an example in which a part of a configuration in any of the exemplary embodiments below is substituted by a part of a configuration in any other exemplary embodiment are also encompassed in the exemplary embodiments of the disclosure.

Exemplary Embodiment 1

(Configuration of Photoelectric Conversion Element)

Figure 1:
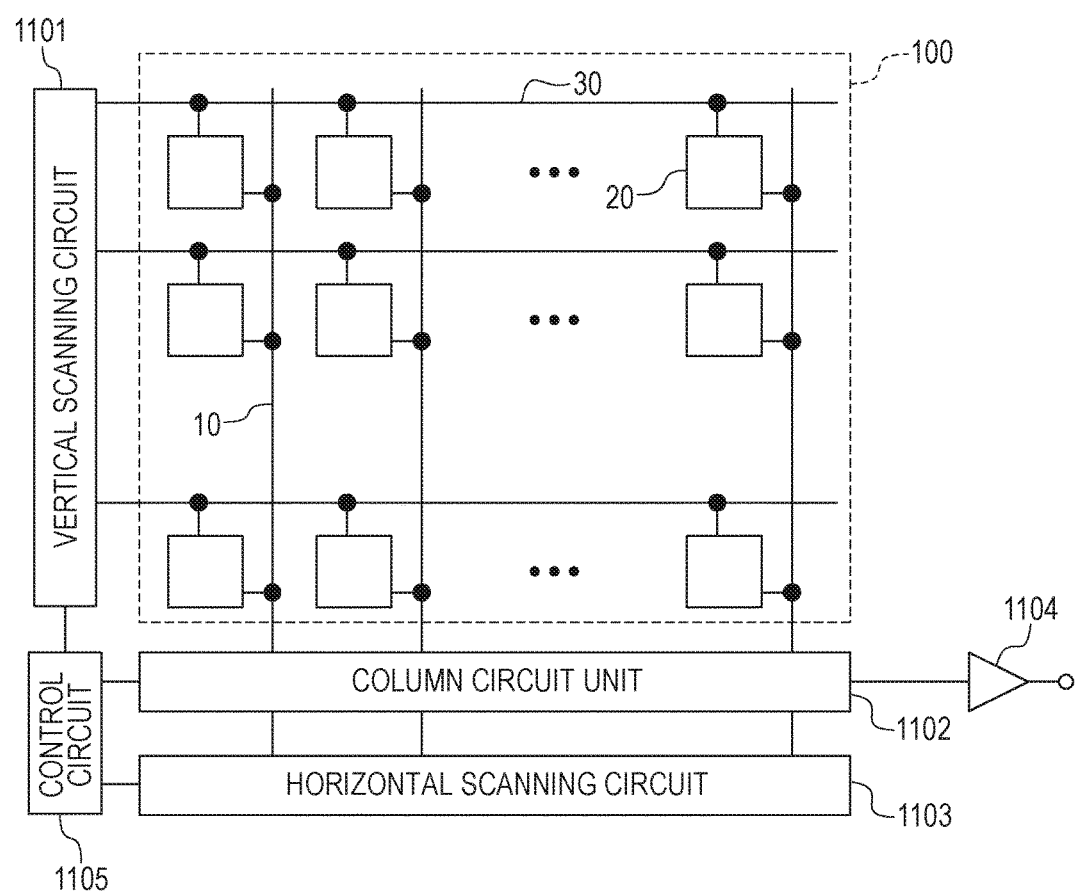
FIG. 1 illustrates a configuration of a photoelectric conversion element, according to one or more embodiment(s) of the present disclosure.

FIG. 1 illustrates a photoelectric conversion element of the present exemplary embodiment. The photoelectric conversion element of the present exemplary embodiment has column signal lines 10 and pixels 20. The pixels 20 are arrayed in a plurality of rows and a plurality of columns in a pixel array 100. The column signal lines 10 are arrayed correspondingly to the columns in which the pixels 20 are arrayed. Moreover, the photoelectric conversion element has a vertical scanning circuit 1101. The pixels 20 in each row are connected to the vertical scanning circuit 1101 via a control line 30 so that a common signal is supplied to the pixels 20 in one row from the vertical scanning circuit 1101. The vertical scanning circuit 1101 is a control unit that controls an accumulating period of each of the pixels 20.

The photoelectric conversion element has a column circuit unit 1102, a horizontal scanning circuit 1103, and an output circuit 1104. The column circuit unit 1102 includes a plurality of column circuits. Each of the plurality of column circuits is arranged correspondingly to one of the plurality of column signal lines 10. Each of the plurality of column circuits outputs a signal, which is obtained by amplifying a signal output to the column signal line 10, to the output circuit 1104.

The horizontal scanning circuit 1103 sequentially makes a selection from the plurality of column circuits included in the column circuit unit 1102. Thereby, the signals, each of which is held by each of the plurality of column circuits, are sequentially output to the output circuit 1104. The output circuit 1104 outputs the signals to an outside of the photoelectric conversion element. The signals output by the output circuit 1104 are signals output by the photoelectric conversion element.

The photoelectric conversion element further has a control circuit 1105. The control circuit 1105 is connected to each of the vertical scanning circuit 1101, the column circuit unit 1102, and the horizontal scanning circuit 1103 via a drive line that supplies a drive signal.

(Circuit Arrangement of Pixels)

Figure 2:
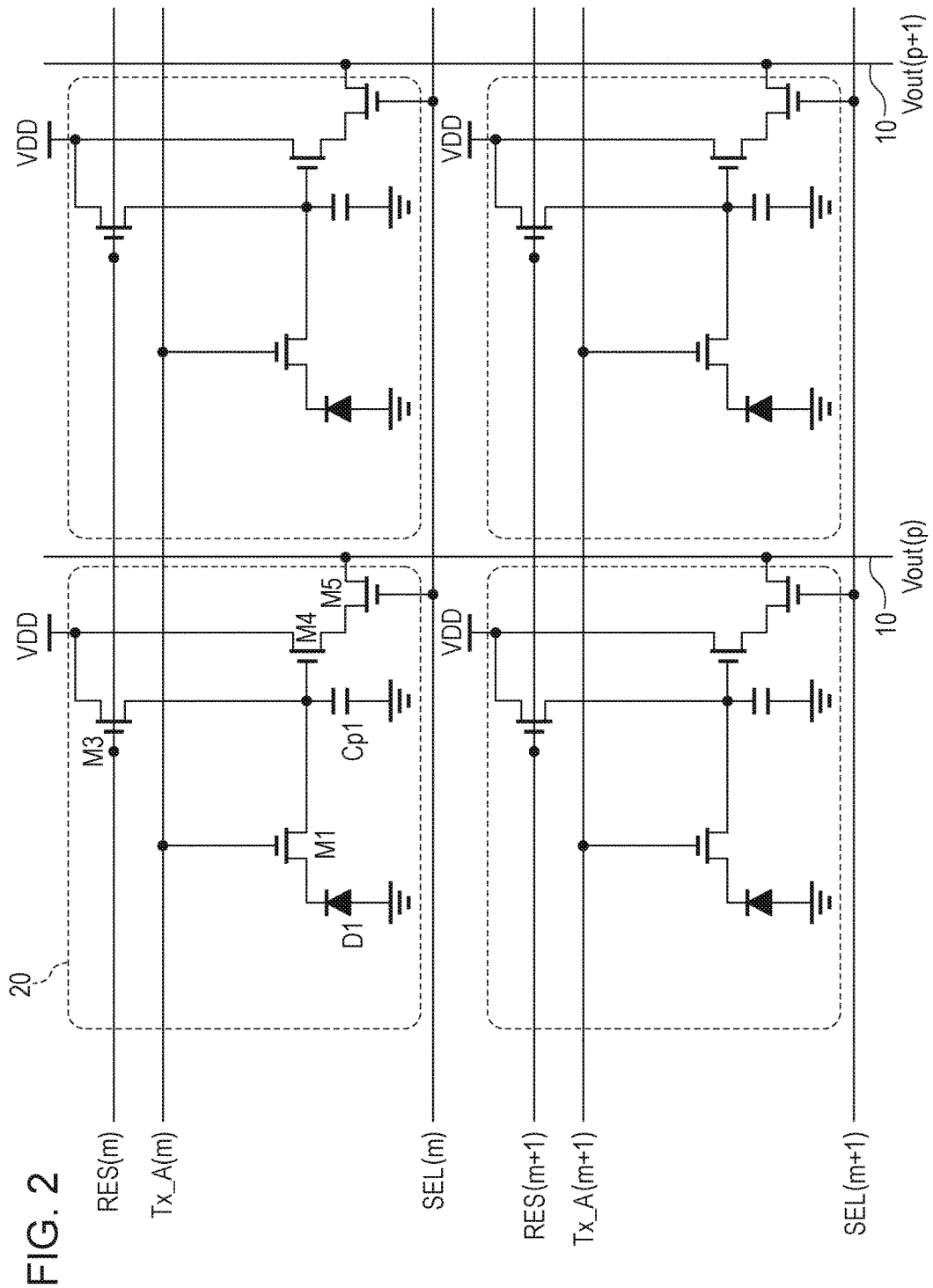
FIG. 2 illustrates circuit arrangement of pixels, according to one or more embodiment (s) of the present disclosure.

FIG. 2 is a circuit diagram illustrating a circuit of each of the pixels 20 in two rows and two columns among the pixels 20 illustrated in FIG. 1. In description below, an electric charge accumulated by a photodiode serving as a photoelectric conversion unit is an electron. All of transistors included in the pixels 20 are N-type transistors. The electric charge accumulated by the photodiode may be a hole. In this case, the transistors of the pixels 20 may be P-type transistors. That is, in accordance with polarity of the electric charge to be handled as a signal, it is possible to change a prescription of a type of conduction to be used in description below.

The pixel 20 has aphotodiode D1 serving as the photoelectric conversion unit, a transfer transistor M1, a floating diffusion capacitor Cp1, a reset transistor M3, an amplification transistor M4, and a selection transistor M5. The transfer transistor M1 is provided on an electric path between a node to which the floating diffusion capacitor Cp1, the reset transistor M3, and the amplification transistor M4 are connected and the photodiode D1. A power source voltage VDD is applied to the reset transistor M3 and the amplification transistor M4. The selection transistor M5 is provided on an electric path between the amplification transistor M4 and the column signal line 10.

Each of a signal RES, a signal Tx_A, and a signal SEL is a signal which is supplied from the vertical scanning circuit 1101 illustrated in FIG. 1 via the control line 30. In FIG. 2, in an end of a reference sign of each of the signals, a number of a pixel row to which the signal is supplied is assigned. For example, a signal RES (m) means the signal RES which is supplied to pixels in an m-th row.

A current source which is not illustrated is connected to the column signal line 10. When a signal SEL(m) becomes at an active level and the selection transistor M5 is thereby turned on, current is supplied to the amplification transistor M4 from the current source. A source follower circuit is formed by the power source voltage VDD, the amplification transistor M4, and the not-illustrated current source which is connected to the column signal line 10. The source follower circuit is formed, and thereby the amplification transistor M4 outputs a signal based on a potential of the floating diffusion capacitor Cp1 to the column signal line 10 via the transistor M5. The signal output to the column signal line 10 is set to be a signal Vout. In FIG. 2, in an end of a reference sign of the signal Vout, a column number of the column signal line 10 is assigned. A signal output to the column signal line 10 in a p-th column is indicated as a signal Vout(p).

(Sectional Structure of Pixel)

Figure 3:
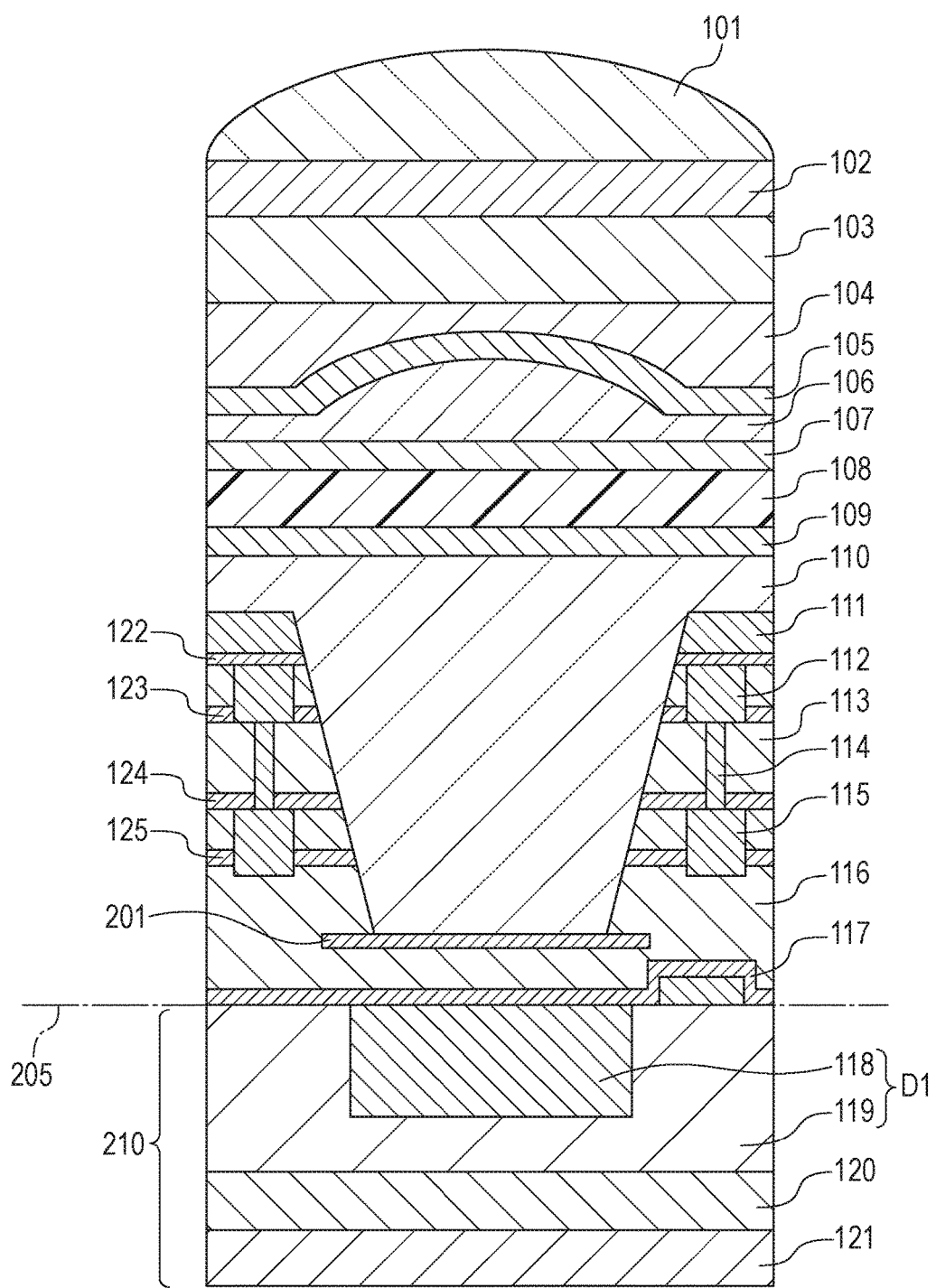
FIG. 3 illustrates a sectional structure of a pixel, according to one or more embodiment(s) of the present disclosure.

FIG. 3 illustrates a sectional structure of a part of the pixel 20.

The pixel 20 has a microlens 101. The microlens 101 condenses light incident on the pixel 20. In order to suppress reflection of light, a material having a refractive index which is close to that of the microlens 101 is generally used for a planarization layer 102.

A color filter 103 absorbs light having a specific wavelength, so that it is possible to vary a wavelength region of light to be transmitted for each of the pixels 20. A planarization layer 104 is disposed so as to cover a convex surface of an interlayer lens 106 which is provided in a lower part thereof. A coating layer 105 has a refractive index between those of the planarization layer 104 and the interlayer lens 106, and has a function of suppressing reflection of incident light, which is directed to the microlens 101.

Each of an intermediate refractive index layer 107 and an intermediate refractive index layer 109 suppresses reflection of light by a passivation film 108, and is used as a protective film of the element. A material having a higher refractive index than those of interlayer films 111, 113, and 116 is used for a light guiding unit 110. Thereby, an effect of shutting light incident on the light guiding unit 110 in is exerted, and efficient propagation is enabled.

An etching stop layer 201 is a layer which is used for stabilizing a position of a bottom surface of the light guiding unit 110 during formation of the light guiding unit 110.

Each of wiring layers 112, 114, and 115 is used as a signal line which reads an electric signal generated in the pixel 20 or the control line 30 which supplies a signal to a gate of each of the transistors and is illustrated in FIG. 1.

An N-type semiconductor region 118, a P-type semiconductor region 119, a block layer 120, and a well 121 are formed in a semiconductor substrate 210.

The photodiode D1 is formed by the N-type semiconductor region 118 and the P-type semiconductor region 119. The N-type semiconductor region 118 functions as an electric charge accumulating unit that accumulates an electric charge generated in the photodiode D1 by photoelectric conversion.

A light receiving surface 205 is a surface on which the photodiode D1 receives light.

A transfer gate 117 is formed of polysilicon. The transfer gate 117 is a gate of the transfer transistor M1, by which an electric signal generated in the photodiode D1 is transferred to the floating diffusion capacitor C illustrated in FIG. 2.

The block layer 120 is a layer that restricts depth of electric charge collection of the N-type semiconductor region 118 and the P-type semiconductor region 119. A barrier of potential is formed by the block layer 120. An electric charge generated by photoelectric conversion is collected in a semiconductor region whose depth is shallower than that of the barrier. Wiring protective films 122 and 124 are used for preventing metal of wiring from being diffused in some cases. Etching stop layers 123 and 125 are used for forming the wiring layers 112 and 115, respectively, in some cases.

(Structure of Light Guiding Unit)

Figure 4A:
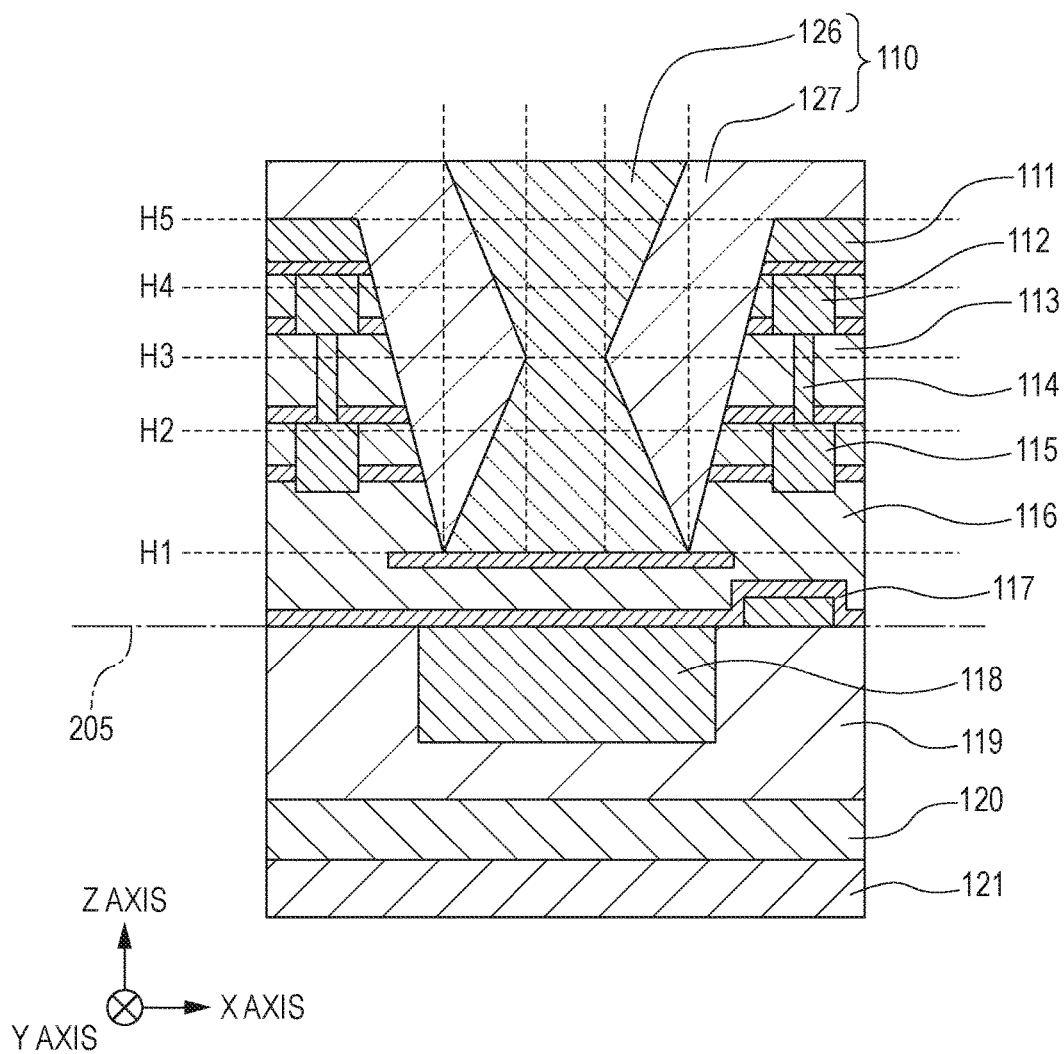
FIG. 4A illustrates a sectional structure of a light guiding unit.

FIG. 4A illustrates a sectional structure of the light guiding unit 110 of the present exemplary embodiment. FIG.

4B illustrates top views of the light guiding unit 110, each of which is a plane parallel to the light receiving surface 205 and obtained at each of planes H1 to H5 illustrated in FIG. 4A.

FIG. 4A will be described. In FIG. 4A, the same reference signs as reference signs in FIG. 3 are assigned to members having the same functions as those of members illustrated in FIG. 3.

The light guiding unit 110 has a low refractive index part 126 and a high refractive index part 127. The low refractive index part 126 has a lower refractive index than that of the high refractive index part 127.

It is possible to form each of the low refractive index part 126 and the high refractive index part 127 of silicon nitride. That is, it is possible to use Si and N as elements which mainly constitute each of the low refractive index part 126 and the high refractive part 127. It is set that the refractive index of the low refractive index part 126 is about 1.5 to 1.9 and the refractive index of the high refractive index part 127 is about 2.0. A difference in the refractive indexes in the light guiding unit 110 is able to be achieved by changing a ratio of silicon to nitrogen. That is, the ratio of silicon to nitrogen for the low refractive index part 126 is set to be lower than that of the high refractive index part 127. Thereby, it is possible to form the low refractive index part 126 and the high refractive index part 127.

In addition, as another formation method of the low refractive index part 126 and the high refractive index part 127, a method of changing density of silicon nitride is also adaptable. That is, density of nitrogen and silicon of the low refractive index part 126 is set to be lower than that of the high refractive index part 127. Thereby, it is possible to form the low refractive index part 126 and the high refractive index part 127.

Additionally, various materials are able to be used for the low refractive index part 126 and the high refractive index part 127. A material of which the low refractive index part 126 and the high refractive index part 127 are formed may be an organic material (resin) or may be an inorganic material. However, for being chemically stable, the inorganic material is desirable. Examples of the resin include siloxane-based resin, polyimide, and the like. As the inorganic material, silicon nitride ($Si_3N_4$), silicon oxynitride (SiOxNy), and titanium oxide ($TiO_2$) are desirable. The low refractive index part 126 and the high refractive index part 127 may be formed of the mutually same material or may be formed of a plurality of materials. General values of refractive indexes of materials of the low refractive index part 126 and the high refractive index part 127 will be cited.

The value of silicon oxide is 1.4 to 1.5, that of silicon oxynitride is 1.6 to 1.9, that of silicon nitride is 1.8 to 2.3, that of titanium oxide is 2.5 to 2.7, and that of each of BSG, PSG, and BPSG is 1.4 to 1.6. Note that, significant figures of each of the values of the refractive indexes described here are two figures, and the second decimal place is rounded off. The aforementioned values are merely examples, and, even in a case of the same material, a nonstoichiometric composition ratio and material density vary when a film formation method is changed, so that it is possible to appropriately set the refractive indexes. Note that, general resin has a refractive index of 1.3 to 1.6, and even high refractive index resin has refractive index of 1.6 to 1.8, but it is possible to make an effective refractive index higher by including an inorganic material having a high refractive index such as metal oxide. Examples of the inorganic material having a high refractive index which is to be included in resin include titanium oxide, tantalum oxide, niobium oxide, tungsten oxide, zirconium oxide, zinc oxide, indium oxide, hafnium oxide, and the like.

Note that, refraction index distribution of an inside of the light guiding unit 110 is able to be formed in an inside of a part (a center part and a side wall part) which constitutes at least a part of the light guiding unit 110 and is occupied by the same material. Practically, it is preferable that a refractive index of an optical path member 220 is 1.6 or more. Moreover, practically, a difference between a maximum value and a minimum value of a refractive index in refractive index distribution of the aforementioned part which is occupied by one material is preferably 0.025 or more, and more preferably 0.050 or more. Note that, the difference between the maximum value and the minimum value of the refractive index is typically 0.50 or less, and is practically 0.25 or less. There are some cases that a boundary between a first high refractive index region and a second high refractive index region is able to be clearly observed, but, in other cases, it is not able to be clearly observed. For example, in a case where the refractive index gradually changes in a plane parallel to the light receiving surface 205 as being closer to an outside of the 1 guiding unit 110 from a center axis of the light guiding unit 110, a boundary between the high refractive index part 127 and the low refractive index part. 126 may not be able to be clearly observed. In such a case, the boundary between the high refractive index part 127 and the low refractive index part 126 is able to be decided as follows. That is, an intermediate value of the maximum value and the minimum value ((maximum value+minimum value)/2) of the refractive index of the part in the light guiding unit 110, which is formed of the same material, is obtained. Then, a line obtained by connecting points of the intermediate value in the refractive index distribution in the light guiding unit 110 is able to be defined as the boundary between the high refractive index part 127 and the low refractive index part 126. Needless to say, the low refractive index part 126 includes a part in which the refractive index is the minimum and the high refractive index part 127 includes a part in which the refractive index is the maximum.

Note that, the "same material" means a material having the same stoichiometric composition. Therefore, it is also possible to regard a material which is deviated from the stoichiometric composition (that is, a nonstoichiometric composition of which is different) and a material whose crystallinity, material density, concentration of an additive (which is less than a main component), or impurities (1 wt % or less) or concentration thereof is different as the "same material". For example, although a stoichiometric composition ratio of silicon nitride is Si:N=3:4, materials whose actual ratios of Si and N are different from each other within a range in which stoichiometric composition ratios thereof are the same are regarded as the same materials. Moreover, single crystal silicon and polysilicon (polycrystal silicon) are regarded as the same materials. Note that, materials whose stoichiometric compositions are different are not the same materials. For example, both titanium monoxide (TiO) and titanium dioxide ($TiO_2$) are compounds of oxygen and titanium (titanium oxide), but are different materials in terms of stoichiometry. As described above, silicon nitride has the refractive index which is considerably higher than that of silicon oxide and has a wider range of a possible refractive index compared with silicon oxynitride, and is therefore desirable as a material of the optical path member 220, which has the refractive index distribution described above. In a case where silicon nitride is used for the optical path member 220, it is possible to form the aforementioned refractive index distribution by changing the film formation method of silicon nitride during film formation. In a case where resin in which metal oxide particles are diffused is used for the optical path member 220, it is possible to form the aforementioned refractive index distribution also by changing concentration of a high refractive index inorganic material such as a metal oxide particle, which is to be contained in the resin. The refractive index distribution of the optical path member 220 is able to be formed of materials which are different from each other. However, when the refractive index distribution is formed of the same material by, for example, the above-described method, the disclosure may exert a remarkable effect.

The plane H5 is an incident surface of the light guiding unit 110, and the plane H1 is an emitting surface of the light guiding unit 110. Moreover, the plane H5 is a plane at a position corresponding to an interlayer film which is positioned closest to a side of the incident surface among the interlayer films 111 to 116.

A width of the low refractive index part 126 in a direction parallel to the light receiving surface simply decreases from the plane H5 to the plane H3. Moreover, the width of the low refractive index part 126 in the direction parallel to the light receiving surface simply increases from the plane H3 to the plane H1.

Description will be given for FIG. 4B.

On the plane H5, a width of the light guiding unit 110 is P1. The width of the low refractive index part 126 is C1. A width of the high refractive index part 127 is P1-C1.

On the plane H4, the width of the light guiding unit 110 is P2. The width of the low refractive index part 126 is C2. The width of the high refractive index part 127 is P2-C2.

On the plane H3, the width of the light guiding unit 110 is P3. The width of the low refractive index part 126 is C3. The width of the high refractive index part 127 is P3-C3.

On the plane H2, the width of the light guiding unit 110 is P4. The width of the low refractive index part 126 is C4. The width of the high refractive index part 127 is P4-C4.

On the plane H1, the width of the light guiding unit 110 is P5. The width of the low refractive index part 126 is C5. The width of the high refractive index part 127 is P5-C5.

The width of the light guiding unit 110 simply decreases from the incident surface to the emitting surface. That is, the width of the light guiding unit 110 satisfies a relation of P1>P2>P3>P4>P5.

The width of the low refractive index part 126 simply decreases from the incident surface to the plane H3, and simply increases from the plane H3 to the emitting surface. That is, the width of the low refractive index part 126 satisfies relations of C1>C2>C3 and C3<C4<C5. A relation of being equal to each other may be satisfied by C1 and C5 and by C2 and C4. In this case, a relation of C1=C5>C2=C4>C3 is satisfied. At this time, in a case where all of plane intervals from H1 to H5 are equal, a decreasing rate of the width from C1 to C3 and an increasing rate of the width from C5 to C3 are equal.

The width of the high refractive index part 127 will be described. The width of the high refractive index part 127 satisfies a relation of (P1-C1)<(P2-C2)<(P3-C3). That is, the width of the high refractive index part 127 simply increases from the incident surface to the plane H3. Moreover, the width of the high refractive index part 127 satisfies relations of (P3-C3)>(P4-C4) and (P4-C4)>(P5-C5). That is, the width of the high refractive index part 127 simply decreases from the plane H3 to the emitting surface.

Effect of Present Exemplary Embodiment

An effect of the present exemplary embodiment will be described by using FIGS. 5A to 5C.

Figure 5A:
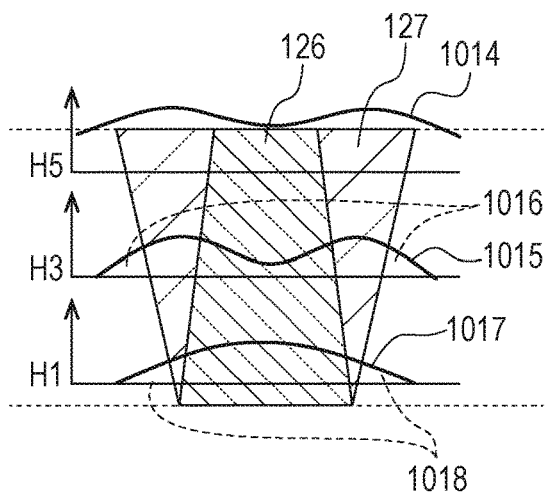
FIGS. 5A and 5B illustrate sectional views of light guiding units.

FIG. 5A illustrates a sectional structure of the light guiding unit 110 of a comparative example. FIG. 5B illustrates a sectional structure of the light guiding unit 110 of the present exemplary embodiment. FIG. 5A illustrates an example in which the width of the low refractive index part 126 simply increases from the incident surface to the emitting surface. FIG. 5A also illustrates an example in which the width of the high refractive index part 127 simply decreases from the incident surface to the emitting surface.

Figure 5B:
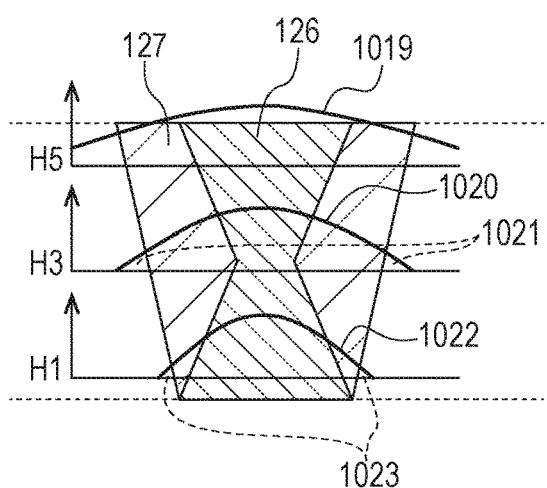

Intensity distribution 1014, 1015, and 1017 illustrated in FIG. 5A and intensity distribution 1019, 1020, and 1022 illustrated in FIG. 5B indicate distribution of light intensity on the plane H5, the plane H3, and the plane H1, respectively. The plane H5 is a first plane which is a plane parallel to the light receiving surface. The plane H3 is a second plane which is a plane parallel to the light receiving surface and is closer to the light receiving surface than the plane H5 serving as the first plane. The plane H1 is a third plane which is a plane parallel to the light receiving surface and is closer to the light receiving surface than the plane H3 serving as the second plane.

In terms of wave optics, light has a property of being localized in a part of a high refractive index. Accordingly, in a case of the structure of FIG. 5A, light condensed by the microlens 101 tends to be localized in the high refractive index part 127 (side wall of the light guiding unit 110) on the plane H5 and light intensity distribution indicated by the intensity distribution 1014 is provided.

In FIG. 5A, the width of the high refractive index part 127 on the plane H5 is wider than that of the structure illustrated in FIG. 5B. As a result, more light is incident on the high refractive index part 127 in the structure of FIG. 5A than the structure of FIG. 5B.

In FIG. 5A, light transmitted through the plane H5 of the light guiding unit. 110 reaches the plane H3. The width of the hi refractive index part 127 decreases on the plane H3 compared with the plane H5, resulting in that the light further shows the tendency of being localized in a part of the side wall of the light guiding unit 110. That is, light intensity distribution indicated by the intensity distribution 1015 is provided.

A part indicated by intensity distribution 1016 is light intensity distribution in a region in the outside of the light guiding unit 110. The intensity distribution 1016 shows that, as the width of the high refractive index part 127 decreases from the plane H5 to the plane H3, light localized in the high refractive index part 127 on the plane H5 becomes unable to remain inside the high refractive index part 127 and leaks out to the outside of the light guiding unit 110. As a result of occurrence of the light leakage, light incident an the photodiode D1 decreases by an amount of the leaked light.

While being transmitted from the plane H3 to the plane H1, the light gradually transits from the high refractive index part 127 to the low refractive index part 126. However, also at this time, a part of light localized in the high refractive index part 127 on the plane H3 leaks out to the outside of the light guiding unit 110 as indicated by intensity distribution 1018. As a result, light incident on the photodiode D1 further decreases by an amount of the leaked light.

Next, description will be given for FIG. 5B which is related to the present exemplary embodiment.

First, on the plane H5, by setting the width of the low refractive index part 126 to be wider than that of the structure illustrated in FIG. 5A, it is possible to set the width of the high refractive index part 127 to be narrow. This makes it possible to reduce light incident on the high refractive index part 127 compared with that of the structure of FIG. 5A.

In FIG. 5B, as the width of the low refractive index part 126 decreases from the plane H5 to the plane H3, the width of the high refractive index part 127 increases. It is thereby possible to reduce leakage of light, which is localized in the high refractive index part 127 on the plane H5, to the outside of the light guiding unit 110.

Moreover, in FIG. 5B, the width of the low refractive index part 126 increases from the plane H3 to the plane H1. It is thereby possible to expedite transition of light localized in the high refractive index part 127 on the plane H3 to the low refractive index part 126 compared with the structure of FIG. 5A. Particularly, an inclination of an interface between the low refractive index part 126 and the high refractive index part 127 from the plane H3 to the plane H1 is greater than that of the structure of FIG. 5A. This makes it possible to further expedite the transition of the light from the high refractive index part 127 to the low refractive index part 126.

In the structure of FIG. 5B, a part of the light localized in the high refractive index part 127 on the plane H3 leaks out to the outside of the light guiding unit 110 as indicated by intensity distribution 1023 in some cases. However, an amount of the leakage is smaller than that of the structure of FIG. 5A.

Figure 5C:
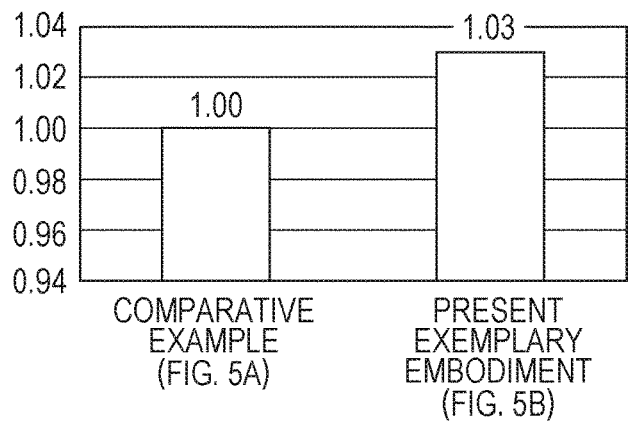
FIG. 5C is a comparative view of light utilization efficiency of a comparative example and an exemplary embodiment, all according to one or more embodiment(s) of the present disclosure.

FIG. 5C illustrates light utilization efficiency in each of the structures of FIG. 5A and FIG. 5B. In FIG. 5C, each ratio of a light amount in the emitting surface to a light amount in the incident surface is standardized with a result of the structure of FIG. 5A as a reference.

According to FIG. 5C, it is found that the structure of FIG. 5B which is related to the present exemplary embodiment has high light utilization efficiency compared with that of the structure of FIG. 5A.

As above, in the present exemplary embodiment, the width of the low refractive index part 126 is set so that a second length on the plane H3 serving as the second plane is shorter than each of a first length on the plane H5 serving as the first plane and a third length on the plane H1 serving as the third lane. Thereby, it is possible to reduce light leakage from the high refractive index part 127 to the outside of the light guiding unit 110.

Exemplary Embodiment 2

As to the present exemplary embodiment, a difference from the exemplary embodiment 1 will be mainly described.

Figure 6A:
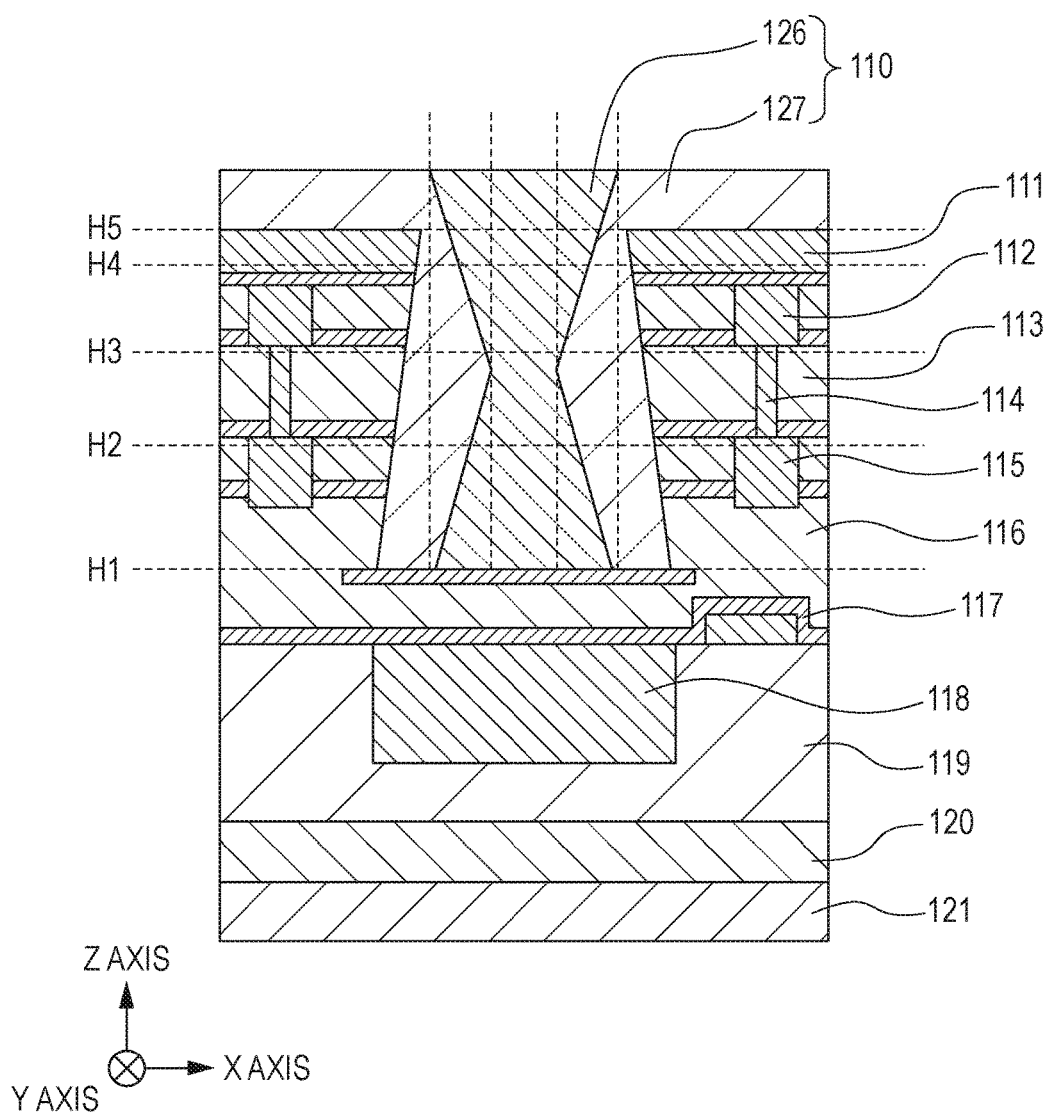
FIG. 6A illustrates a sectional structure of a pixel.

FIG. 6A illustrates a sectional structure of the light guiding unit 110 of the present exemplary embodiment. The light guiding unit 110 has a configuration in which the width thereof simply increases from the plane H5 to the plane H1.

FIG. 6B illustrates a top view of the light guiding unit 110 on each of the planes H1 to H5 illustrated in FIG. 6A.

In the present exemplary embodiment, the width of the light guiding unit 110 on each of the planes satisfies a relation of P1<P2<P3<P4<P5. The width of the low refractive index part 126 on each of the planes satisfies relations of C1>C2>C3 and C3<C4<C5. The width of the high refractive index part 127 on each of the planes satisfies relations of (P1-C1)<(P2-C2)<(P3-C3) and (P3-C3)>(P4-C4)>(P5-C5).

In the light guiding unit 110 of the present exemplary embodiment, the width of the high refractive index part 127 on the incident surface is set to be shorter than that of the light guiding unit 110 of the exemplary embodiment 1. Thereby, it is possible to reduce light incident on the high refractive index part 127 on the plane H5 which is the incident surface compared with the configuration of the light guiding unit 110 of the exemplary embodiment 1. As a result, it is possible to reduce light which leaks out from the high refractive index part 127 to the outside of the light guiding unit 110 on the planes H1 to H5. Thus, the light guiding unit 110 of the present exemplary embodiment has an effect by which light utilization efficiency of the light guiding unit 110 is able to be increased compared with that of the light guiding unit 110 of the exemplary embodiment 1.

Exemplary Embodiment 3

As to a photoelectric conversion element of the present exemplary embodiment, a difference from the exemplary embodiment 1 will be mainly described.

In each pixel 20 of the photoelectric conversion element of the present exemplary embodiment, a plurality of photodiodes are disposed for one microlens. In order to guide light to the plurality of photodiodes, the light guiding unit 110 has an elliptical shape when viewed from a top surface.

Figure 7:
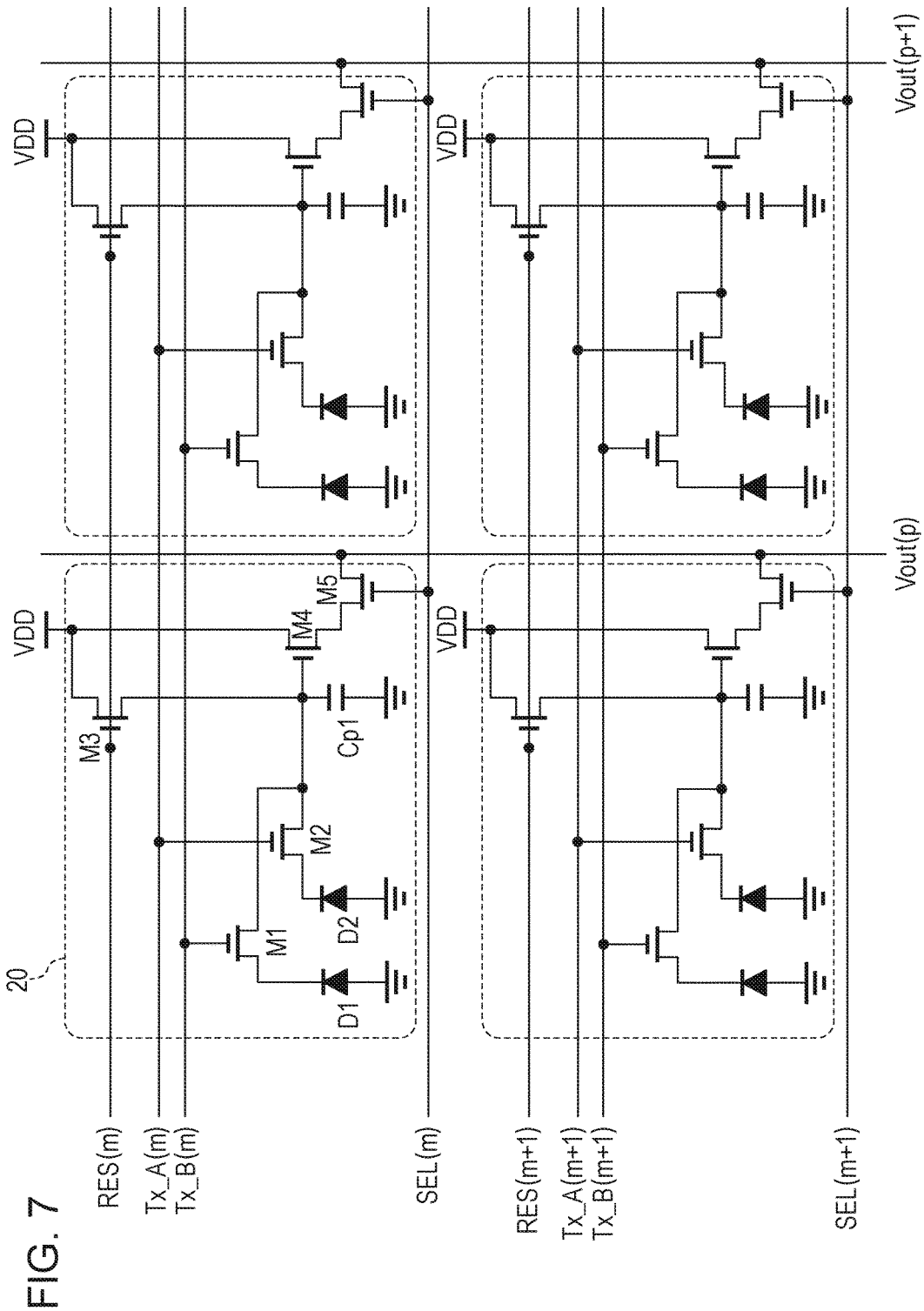
FIG. 7 illustrates circuit arrangement of a pixel, according to one or more embodiment(s) of the present disclosure.

FIG. 7 is a circuit diagram of the pixels 20 included in the photoelectric conversion element of the present exemplary embodiment. The pixel 20 includes the photodiode D1 and a photodiode D2. The photodiode D1 is connected to the floating diffusion capacitor Cp1 via the transfer transistor M1. The photodiode D2 is connected to the floating diffusion capacitor Cp1 via a transfer transistor M2.

A signal Tx_A is applied to a gate of the transfer transistor M1 from the vertical scanning circuit 1101. A signal Tx_B is applied to a gate of the transfer transistor M2 from the vertical scanning circuit 1101.

When the signal Tx_A becomes at an active level, the transfer transistor M1 is turned on. Thereby, an electric charge accumulated by the photodiode D1 is transferred to the floating diffusion capacitor Cp1. A signal which is output by the amplification transistor M4 on the basis of the electric charge accumulated by the photodiode D1 is set to be an A signal.

When the signal Tx_B becomes at the active level in a state where the floating diffusion capacitor Cp1 holds the electric charge of the photodiode D1, the transfer transistor M2 is turned on. Thereby, a sum of the electric charge accumulated by the photodiode D1 and an electric charge accumulated by the photodiode D2 is held in the floating diffusion capacitor Cp1. A signal which is output by the amplification transistor M4 on the basis of the sum of the electric charges accumulated by the photodiodes D1 and D2 is set to be an A+B signal.

Thereafter, in the column circuit unit 1102 or a circuit in an outside of the photoelectric conversion element, which is in an imaging system including the photoelectric conversion element, processing of obtaining a B signal by subtracting the A signal from the A+B signal is performed. The imaging system is able to perform an autofocus operation of a phase difference detecting method by using the obtained B signal and the A signal. Moreover, the imaging system is able to generate an image by using the A+B signal.

FIG. 8A illustrates a sectional structure of the pixel 20 of the present exemplary embodiment. Although not illustrated in FIG. 8A, one piece of the microlens 101 is provided above the light guiding unit 110 as illustrated in FIG. 3. Accordingly, one piece of the microlens 101 is disposed for an N-type semiconductor region 118-1 and an N-type semiconductor region 118-2. The N-type semiconductor region 118-1 and the P-type semiconductor region 119 constitute the photodiode D1. Moreover, the N-type semiconductor region 118-2 and the P-type semiconductor region 119 constitute the photodiode D2. Thus, it can be said that two photodiodes are disposed for one microlens. Note that, an example in which two photodiodes are disposed for one microlens is illustrated in the present exemplary embodiment. As another example, more photodiodes may be disposed for one microlens. That is, what is required is only disposing a plurality of photodiodes for one microlens.

FIG. 8B illustrates a top view of the light guiding unit 110 an each of the planes H1 to H5. The light guiding unit 110 of the present exemplary embodiment has the elliptical shape. Correspondingly thereto, the low refractive index part 126 also has an elliptical shape.

A length of the width of the light guiding unit 110 satisfies a relation of P1>P2>P3>P4>P5. A length of the width of the low refractive index part 126 satisfies relations of C1>C2>C3 and C3<C4<C5. A length of the width of the high refractive index part 127 satisfies relations of (P1-C1)<(P2-C2)<(P3-C3) and (P3-C3)>(P4-C4)>(P5-C5).

Also in the present exemplary embodiment, a relation of the lengths of the widths of the low refractive index part 126 and the high refractive index part 127 on each of the planes H1 to H5 is the same as that of the exemplary embodiment 1. Thus, also in a configuration in which a plurality of photodiodes are provided for one microlens, it is possible to achieve the same effect as that of the exemplary embodiment 1.

Exemplary Embodiment 4

As to a photoelectric conversion element of the present exemplary embodiment, a difference from the exemplary embodiment 1 will be mainly described. The pixel 20 of the photoelectric conversion element of the present exemplary embodiment further includes a holding capacitor Cp2 on an electrical path between the photodiode D1 and the floating diffusion capacitor Cp1. The photodiode D1 starts accumulation of an electric charge at the same timing in all of the pixels 20, and, furthermore, a transfer operation of the electric charge from the photodiode D1 to the holding capacitor Cp2 is finished at the same timing in all of the pixels 20. Thereby, the photoelectric conversion element of the present exemplary embodiment is able to realize a global electronic shutter.

Figure 9:
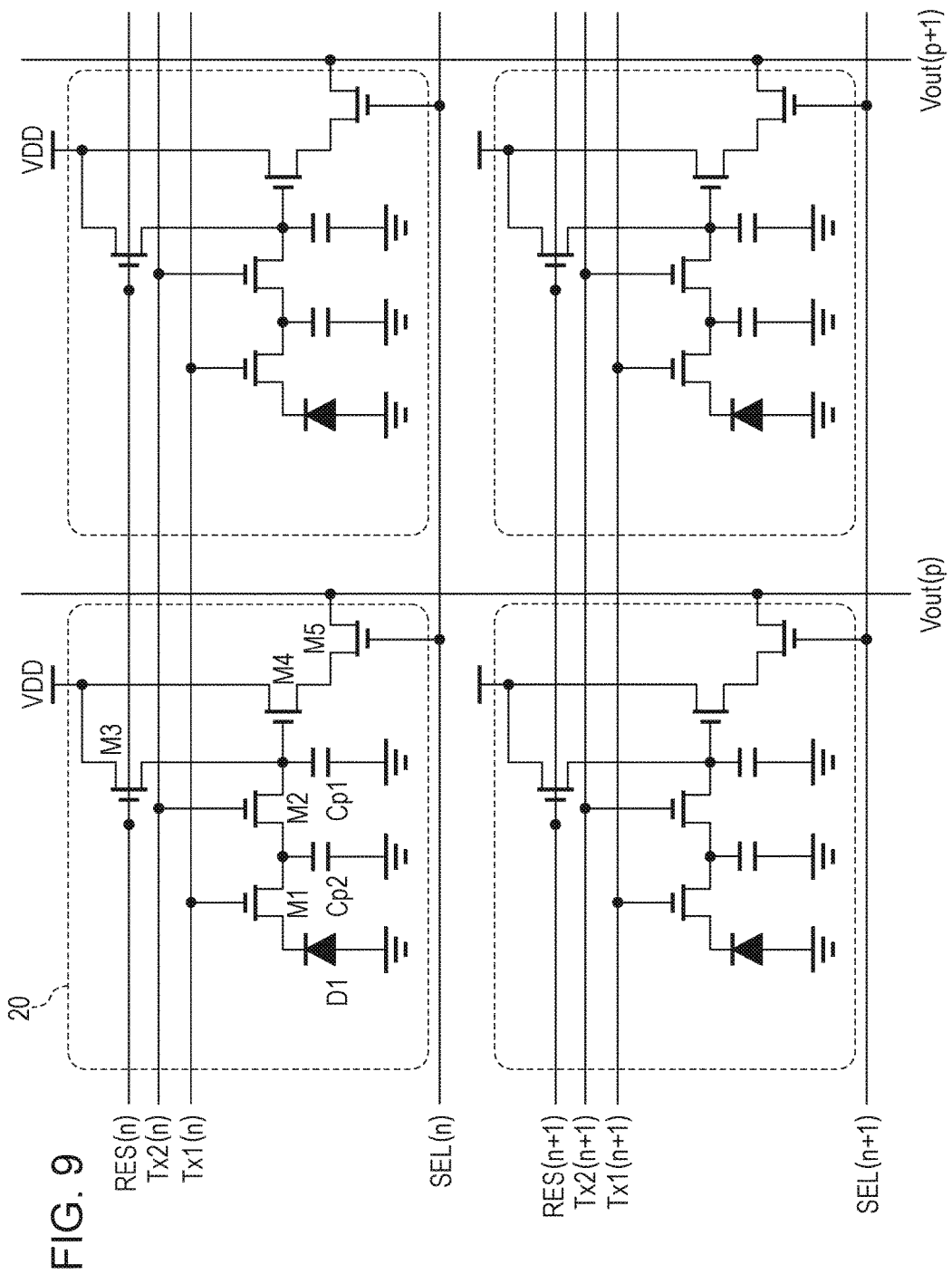
FIG. 9 illustrates circuit arrangement of a pixel, according to one or more embodiment(s) of the present disclosure.

FIG. 9 is a circuit diagram of the pixels 20 of the present exemplary embodiment. The pixel 20 of the present exemplary embodiment further includes the holding capacitor Cp2 and a transistor M2 in addition to what is included in the pixel 20 of the exemplary embodiment 1. A signal Tx1 is applied to a gate of a transistor M1 from the vertical scanning circuit 1101, and a signal Tx2 is applied to a gate of the transistor M2 from the vertical scanning circuit 1101.

The photodiodes D1 in all of the pixels 20 start accumulation of an electric charge at the same time. Thereafter, the vertical scanning circuit 1101 sets the signals Tx1, which is to be supplied to the pixels 20, to be at an active level in all of the columns at the same time, and sets the signals Tx1 to be at a non-active level in all of the columns at the same time. Thereby, an electric charge accumulated by the photodiode D1 is transferred to the holding capacitor Cp2 in all of the pixels 20. Timing of each of start and finish of an electric charge accumulating period to which the electric charge accumulated by the holding capacitor Cp2 corresponds is the same in all of the pixels 20. In this manner, the photoelectric conversion element of the present exemplary embodiment is able to realize the global electronic shutter.

Then, the vertical scanning circuit 1101 sequentially sets the signal Tx2 and the signal SEL to be at the active level in a row unit. Thereby, signals based on the electric charges accumulated by the photodiodes D1 are output from the pixels 20 in each column.

Figure 10A:
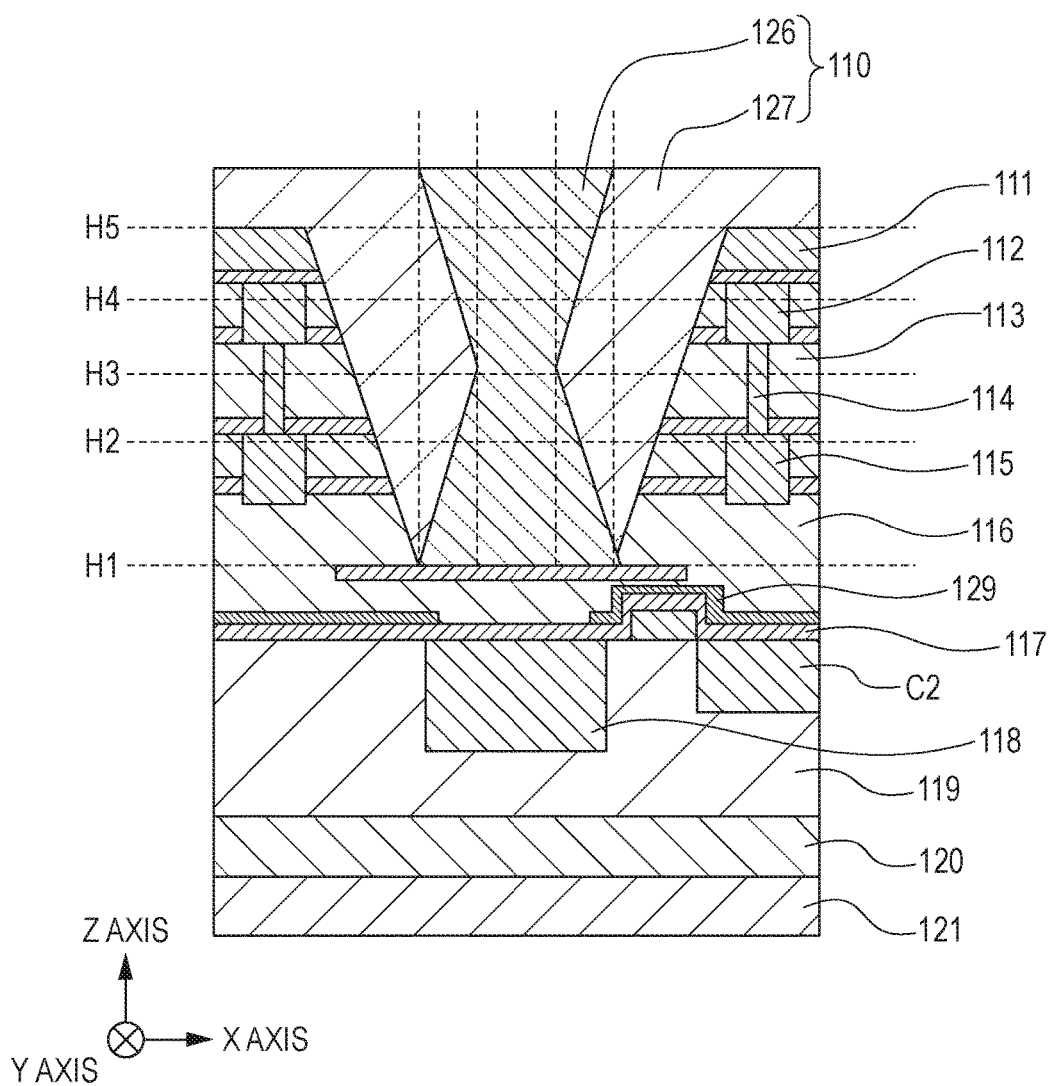
FIG. 10A illustrates a sectional structure of the pixel.

FIG. 10A illustrates a sectional structure of the pixel 20 of the present exemplary embodiment. In the present exemplary embodiment, the holding capacitor Cp2 is provided. In addition, a light shielding unit 129 is provided in order to suppress incidence of light on the holding capacitor Cp2. Any material may be used for the light shielding unit 129 as long as being able to shield light, and a metal material such as tungsten may be used, for example.

Figure 10B:
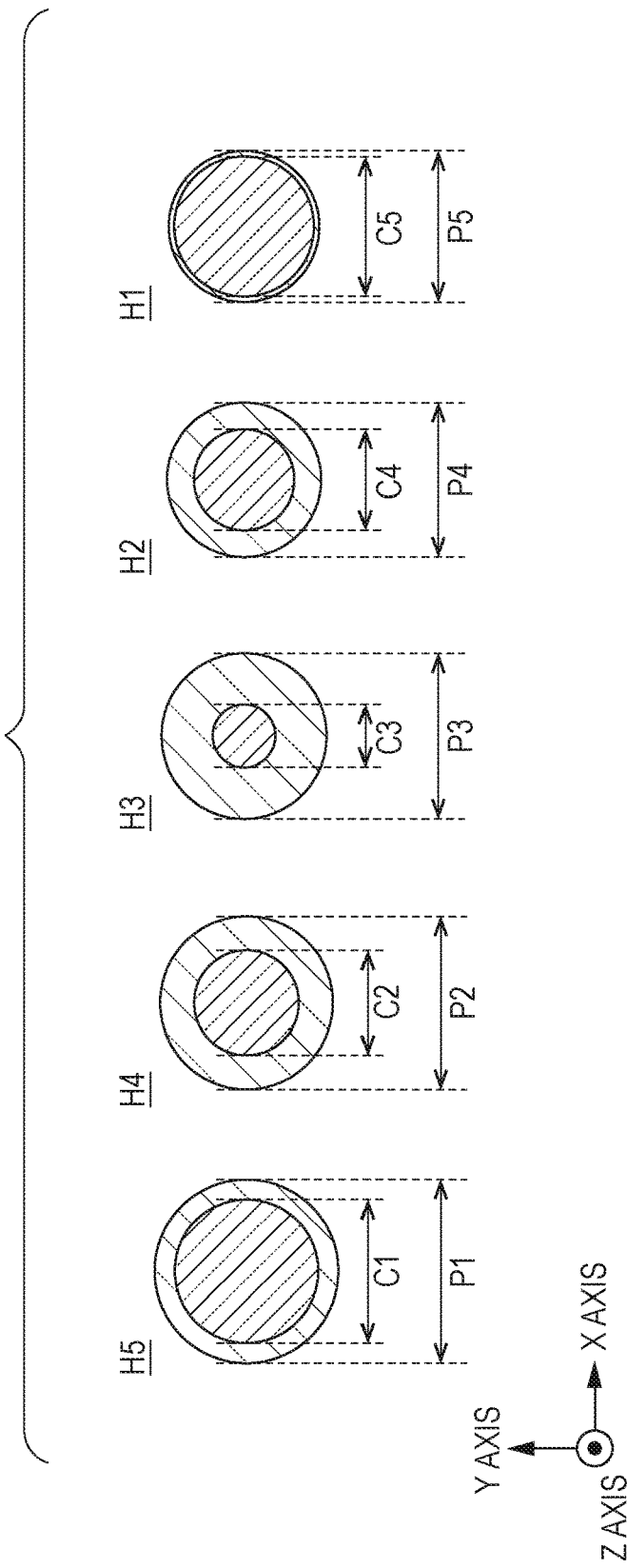
FIG. 10B illustrates top views of a light guiding unit, both according to one or more embodiment(s) of the present disclosure.

FIG. 10B illustrates a top view of the light guiding unit 110 on each of the planes H1 to H5.

The width of the light guiding unit 110 satisfies a relation of P1>P2>P3>P4>P5. The width of the low refractive index part 126 satisfies relations of C1>C2>C3 and C3<C4<C5. The width of the high refractive index part 127 satisfies relations of (P1-C1)<(P2-C2)<(P3-C3) and (P3-C3)>(P4-C4)>(P5-C5).

Also in the present exemplary embodiment, a relation of the lengths of the widths of the low refractive index part 126 and the high refractive index part 127 on each of the planes H1 to H5 is the same as that of the exemplary embodiment 1. Thus, also in a configuration in which the holding capacitor Cp2 that enables a global electronic shutter operation is provided, it is possible to achieve the same effect as that of the exemplary embodiment 1.

Exemplary Embodiment 5

As to a photoelectric conversion element of the present exemplary embodiment, a difference from the exemplary embodiment 4 will be mainly described.

The pixel 20 of the photoelectric conversion element of the present exemplary embodiment also has the holding capacitor Cp2, by which the global electronic shutter operation is enabled, in the same way as the exemplary embodiment 4. The present exemplary embodiment is different from the exemplary embodiment 4 in that the light guiding unit 110 of the present exemplary embodiment has a configuration in which light is difficult to be incident on the holding capacitor Cp2 compared with the light guiding unit 110 of the exemplary embodiment 4.

Figure 11A:
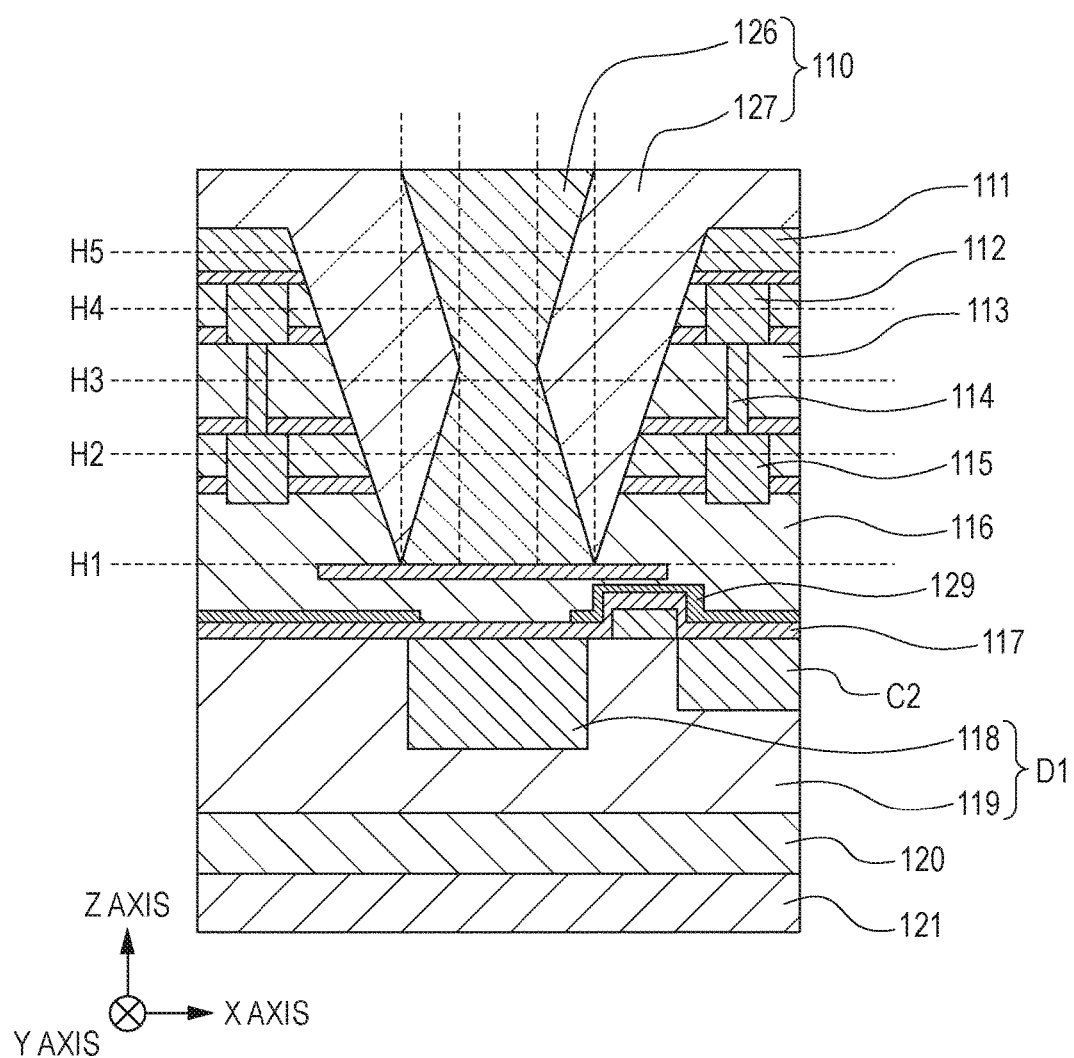
FIG. 11A illustrates a sectional structure of a pixel.

FIG. 11A illustrates a sectional structure of the pixel 20 of the present exemplary embodiment. The holding capacitor Cp2 is provided in a direction along an X-axis direction with respect to the photodiode D1.

FIG. 11B illustrates a top view of the light guiding unit 110 on each of the planes H1 to H5. The light guiding unit 110 of the present exemplary embodiment has a perfect circular shape. On the other hand, the low refractive index part 126 has an elliptical shape.

The width of the light guiding unit 110 satisfies a relation of P1>P2>P3>P4>P5. The width of the low refractive index part 126 satisfies relations of C1>C2>C3 and C3<C4<C5.

The width of the high refractive index part 127 satisfies relations of (P1-C1)<(P2-C2)<(P3-C3) and (P3-C3)>(P4-C4)>(P5-C5).

Also in the present exemplary embodiment, a relation of the lengths of the widths of the low refractive index part 126 and the high refractive index part 127 on each of the planes H1 to H5 is the same as that of the exemplary embodiment 4.

Furthermore, in the present exemplary embodiment, a length of the high refractive index part 127 in the X-axis direction is set to be shorter than a length in a Y-axis direction in each of the planes H1 to H5 of the light guiding unit 110. As described above, light incident on the high refractive index part 127 tends to be localized in the high refractive index part 127. A width of a first part in the high refractive index part 127, which is close to the holding capacitor Cp2, in a first direction which is a direction from the photodiode D1 to the holding capacitor Cp2 is set to be a first width. A width of a second part in the high refractive index part 127, which is apart from the holding capacitor Cp2 more than the first part, in a second direction which is a direction which intersects with the first direction in plan view is set to be a second width. The second direction is typically orthogonal to the first direction in plan view. The first width is set to be shorter than the second width. Thereby, less light is localized in the first part compared with that of a configuration of the light guiding unit 110 of the exemplary embodiment 4. Thus, the light guiding unit 110 of the present exemplary embodiment has a greater effect by which light incident on the holding capacitor Cp2 is able to be reduced compared with the configuration of the light guiding unit 110 of the exemplary embodiment 4.

Exemplary Embodiment 6

In the present exemplary embodiment, a manufacturing method of the light guiding unit 110 will be described with reference to FIGS. 12A to 12C. Although description will be given mainly for the manufacturing method of the light guiding unit 110 of the exemplary embodiment 1 in the present exemplary embodiment, the manufacturing method of the present exemplary embodiment is applicable also to the light guiding unit 110 of each of the other exemplary embodiments.

Figure 12A:
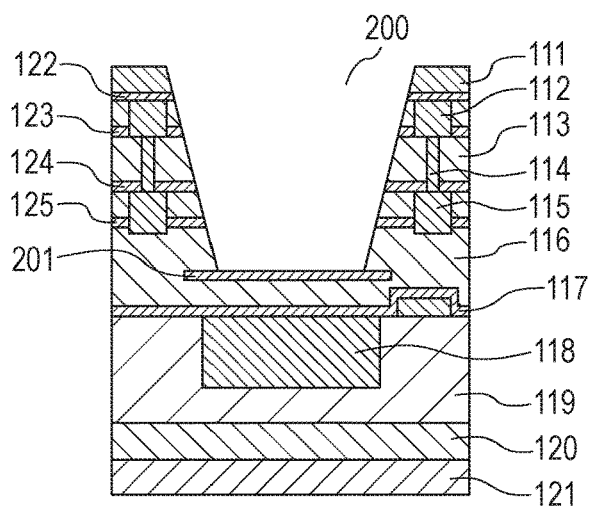
FIGS. 12A to 12C illustrate a manufacturing method of a light guiding unit, all according to one or more embodiment(s) of the present disclosure.

As illustrated in FIG. 12A, the well 121, the block layer 120, the N-type semiconductor region 118, and the P-type semiconductor region 119 are formed on a semiconductor substrate. Moreover, the transfer gate 117, the interlayer films 116, 113, and 111, the etching stop layers 201, 125, and 123, the wiring protective films 124 and 122, and the wiring layers 115, 114, and 112 are formed. Thereafter, patterning by photolithography is performed. Then, an opening 200 is formed by etching the interlayer films 116, 113, and 111 and the etching stop layers 125 and 123 as far as the etching stop layer 201.

Figure 12B:
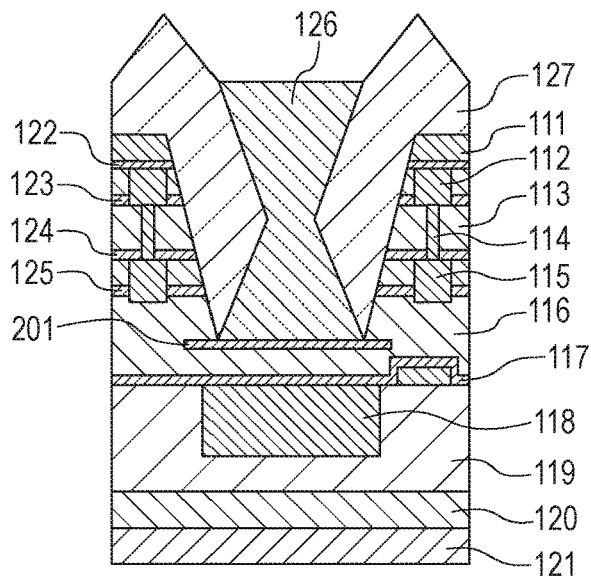

Next, as illustrated in FIG. 12B, an embedded member formed of, for example, a silicon nitride film is embedded in the opening 200 by high-density plasma chemical vapor deposition (HDP-CVD) by using a process gas having a sputtering property, such as Ar or He. Thereby, the low refractive index part 126 and the high refractive index part 127 are formed.

In the embedding process, by using Ar, He, or the like which has the sputtering property as the process gas, embedding is performed in the semiconductor substrate while applying bias of, for example, 13.56 MHz. Thereby, the gas having the sputtering property, such as Ar or He, collides the deposited embedded member. Thus, the embedded member deposited in the opening 200 is subjected to sputtering by the gas having the sputtering property. As a result, it is possible to reattach the embedded member from an upper part of the opening 200 to a side wall part of the opening 200.

A percentage of a content of the process gas contained in the embedded member is greater in a center part of the opening 200 than in the embedded member reattached from the upper part to the side wall part of the opening 200. For example, in a case where Ar is used for the process gas, a percentage of a content of Ar in the embedded member is greater in the embedded member deposited in the center part of the opening 200 than in the embedded member reattached from the upper part to the side wall part of the opening 200. Thereby, the refractive index of the light guiding unit 110 is lower in the center part than in the side wall part.

By appropriately setting a ratio of the process gas and bias, which is to be applied, in accordance with a shape of the opening 200, it is possible to form the low refractive index part 126 having a constricted shape as in FIG. 12B.

Figure 12C:
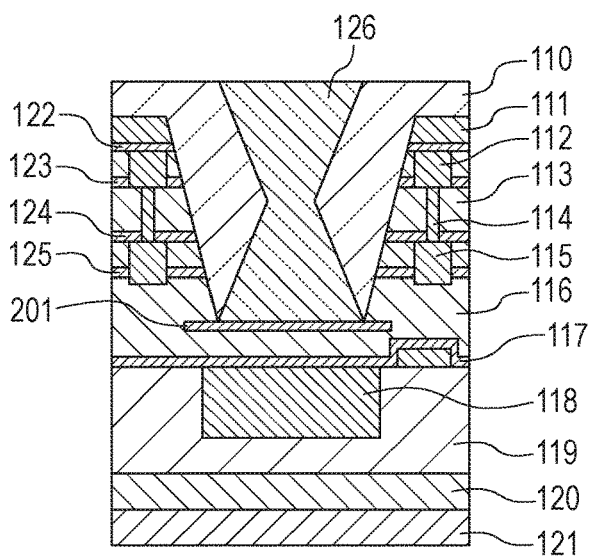

Next, as illustrated in FIG. 12C, by performing flattening, for example, by CMP (chemical mechanical polishing), the low refractive index part 126 and the high refractive index part 127 are formed. It is thereby possible to form the light guiding unit 110 having the low refractive index part 126 and the high refractive index part 127.

As described above, the process gas (for example, Ar or He) is contained more in the center part of the light guiding unit 110 than in the side wall part. That is, the low refractive index part 126 is to contain the process gas (for example, Ar or He) more than the high refractive index part 127.

Exemplary Embodiment 7

Figure 13:
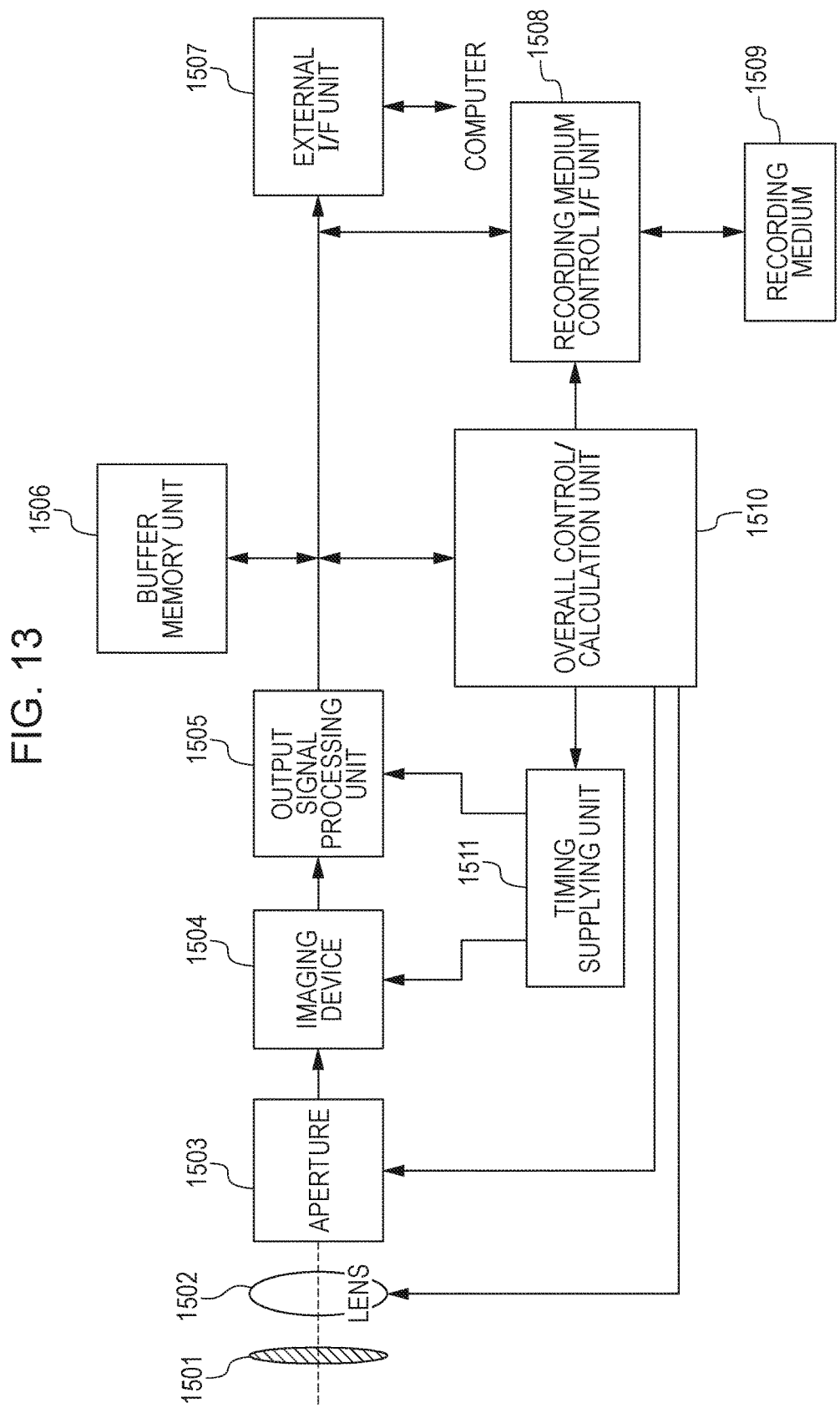
FIG. 13 illustrates a configuration of an imaging system, according to one or more embodiment (s) of the present disclosure.

An exemplary embodiment of an imaging system according to the disclosure will be described. Examples of the imaging system include a digital still camera, a digital camcorder, a camera head, a copier, a facsimile, a cellular phone, an on-vehicle camera, an observation satellite, and the like. FIG. 13 illustrates a block diagram of a digital still camera as an example of the imaging system.

The present exemplary embodiment relates to the imaging system that includes the photoelectric conversion element of each of the above-described exemplary embodiments as an imaging device 1504.

The imaging system exemplified in FIG. 13 includes a barrier 1501 for protection of a lens 1502, the lens 1502 that forms an optical image of an object on the imaging device 1504, and an aperture 1503 with which an amount of light transmitted through the lens 1502 is changeable. The lens 1502 and the aperture 1503 are included in an optical system that condenses light on the imaging device 1504. Moreover, the imaging system exemplified in FIG. 13 includes an output signal processing unit 1505 that performs processing for an output signal output from the imaging device 1504. The output signal processing unit 1505 performs, as necessary, an operation of performing various types of correction and compression and outputting a signal.

The output signal processing unit 1505 performs an operation of generating an image by using the signal output by the imaging device 1504.

The imaging system exemplified in FIG. 13 further includes a buffer memory unit 1506 that temporally stores image data, and an external interface unit 1507 that performs communication with an external computer or the like. Additionally, the imaging system includes a recording medium 1509, such as a semiconductor memory, which records or reads imaging data and is detachably mounted, and a recording medium control interface unit 1508 that performs recording in or reading from the recording medium 1509. Furthermore, the imaging system includes an overall control/calculation unit 1510 that performs various types of calculation and controls the digital still camera overall, and a timing supplying unit 1511 that outputs various timing signals to the imaging device 1504 and the output signal processing unit 1505. Here, a timing signal or the like may be input from an outside, and the imaging system is required only to include at least the imaging device 1504 and the output signal processing unit 1505 that performs processing for the output signal output from the imaging device 1504.

Moreover, as described in the exemplary embodiment 3, there are some cases where a plurality of photodiodes are provided for one microlens in each of the pixels 20. In this case, the output signal processing unit 1505 performs processing for a signal based on an electric charge generated by a part of the plurality of photodiodes and a signal based on an electric charge generated by another part of the plurality of photodiodes. Thereby, it is possible to acquire distance information from the imaging device 1504 to the object. That is, the output signal processing unit 1505 uses a signal based on an electric signal generated by a part of a plurality of photoelectric conversion units provided for one microlens and a signal based on an electric charge generated by another part of the photoelectric conversion units. The output signal processing unit 1505 may thereby acquire the distance information from the imaging device 1504 to the object. In this case, the signal based on the electric charge generated by another part of the photoelectric conversion units may be obtained by subtracting the signal based on the electric charge generated by the part of the photoelectric conversion units from a signal based on a sum of electric charges generated by the plurality of photoelectric conversion units.

The output signal processing unit 1505 is provided on a second semiconductor substrate which is separated from a first semiconductor substrate on which the imaging device 1504 is formed. The first semiconductor substrate and the second semiconductor substrate may be made in different chips or may be laminated to be made in one chip.

Description has been given for an example in which the photoelectric conversion element used as the imaging device 1504 includes an AD conversion unit 204. As another example, the output signal processing unit 1505 may include the AD conversion unit 204. In this case, the imaging device 1504 outputs an analog signal to the output signal processing unit 1505.

As above, the imaging system of the present exemplary embodiment is able to perform an imaging operation by applying the imaging device 1504.

Exemplary Embodiment 8

Figure 14A:
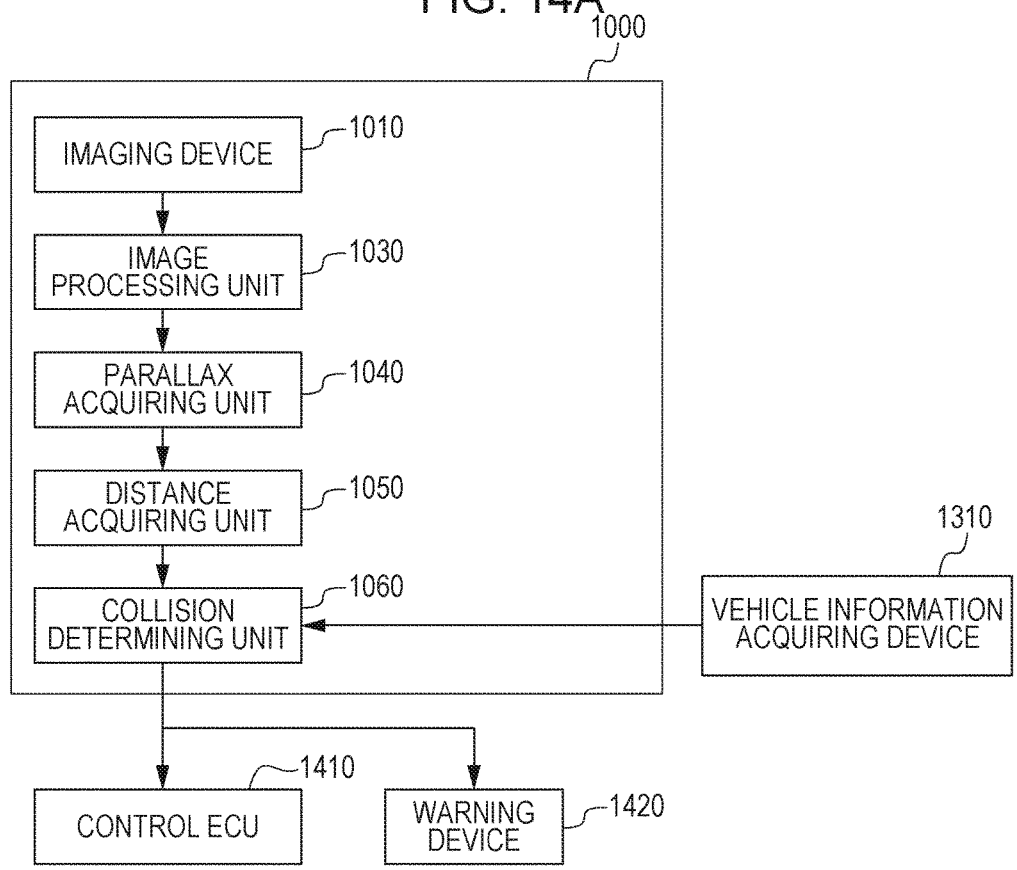
FIGS. 14A and 14B illustrate a configuration of an imaging system, both according to one or more embodiment(s) of the present disclosure.

FIG. 14A illustrates an example of an imaging system related to an on-vehicle camera. An imaging system 1000 is an imaging system that includes the photoelectric conversion element of each of the above-described exemplary embodiments as an imaging device 1010. The imaging system 1000 includes an image processing unit 1030 that performs image processing for a plurality of pieces of image data acquired by the imaging device 1010 and a parallax acquiring unit 1040 that acquires parallax (phase difference of parallax images) from a plurality of pieces of image data acquired by the imaging system 1000.

In a case where the imaging system 1000 is a form of a stereo camera that has a plurality of imaging devices 1010, the acquisition of parallax is able to be performed by using each signal output from each of the plurality of imaging devices 1010. Moreover, there is a case where the imaging system 1000 includes the imaging device 1010 that includes a plurality of photoelectric conversion units for one microlens. In this case, the parallax acquiring unit 1040 acquires parallax by performing processing for a signal based on an electric charge generated by a part of a plurality of photodiodes and a signal based on an electric charge generated by another part of the plurality of photodiodes. That is, the parallax acquiring unit 1040 may acquire parallax by using a signal based on an electric charge generated by a part of the plurality of photoelectric conversion units provided for one microlens and a signal based on an electric charge generated by another part of the photoelectric conversion units. In this case, the signal based on the electric charge generated by another part of the photoelectric conversion units may be obtained by subtracting the signal based on the electric charge generated by the part of the photoelectric conversion units from a signal based on a sum of electric charges generated by the plurality of photoelectric conversion units.

The imaging system 1000 includes a distance acquiring unit 1050 that acquires a distance to a target object on the basis of the acquired parallax and a collision determining unit 1060 that determines, on the basis of the acquired distance, whether or not there is a possibility of collision. In this case, the parallax acquiring unit 1040 and the distance acquiring unit 1050 are examples of a distance information acquiring unit configured to acquire distance information to the target object. That is, the distance information is information related to parallax, a de-focusing amount, a distance to a target object, or the like. The collision determining unit 1060 may determine a possibility of collision by using any piece of such distance information. The distance information acquiring unit may be realized by hardware that is designed exclusively, may be realized by a software module, or may be realized by a combination thereof. Moreover, the distance information acquiring unit may be realized by an FPGA (Field Programmable Gate Array), an ASIC (Application Specific integrated Circuit), or the like. In addition, the distance information acquiring unit may be realized by a combination of the FPGA and the ASIC.

The imaging system 1000 is connected to a vehicle information acquiring device 1310, and is able to acquire vehicle information such as a vehicle speed, a yaw rate, or a steering angle. Moreover, the imaging system 1000 is connected to a control ECU 1410 that is a control device which outputs a control signal, by which braking force is generated with respect to a vehicle, on the basis of a determination result of the collision determining unit 1060. In addition, the imaging system 1000 is connected also to a warning device 1420 that gives a warning to a driver on the basis of the determination result of the collision determining unit 1060. For example, in a case where, as the determination result of the collision determining unit 1060, there is a high possibility of collision, the control ECU 1410 performs vehicle control for avoiding collision and reducing damage by braking, releasing an accelerator, suppressing engine output, or the like. The warning device 1420 gives a warning to a user by raising a warning such as a sound, displaying warning information on a screen of a car navigation system or the like, transmitting vibrations to a seat belt or a steering wheel, or the like.

In the present embodiment, the imaging system 1000 images a periphery of a vehicle, for example, a front side or a rear side thereof.

Figure 14B:
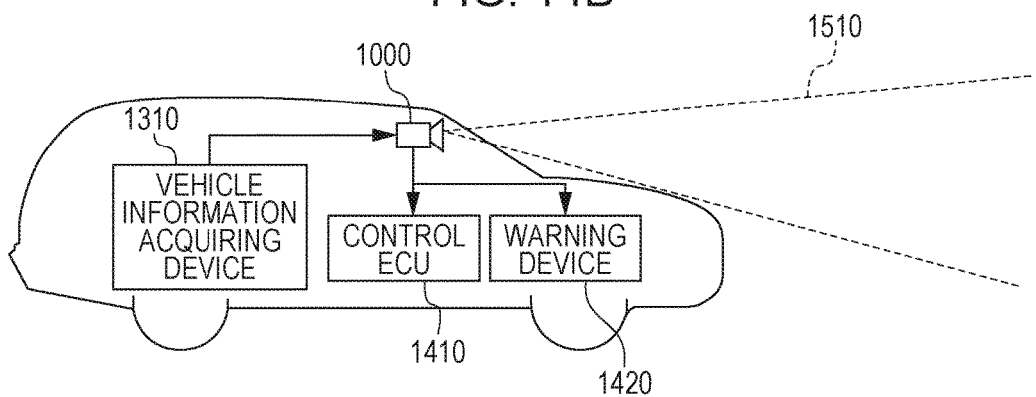

FIG. 14B illustrates the imaging system 1000 in a case of imaging a front side of a vehicle. Although control of avoiding collision with another vehicle has been described above, the imaging system 1000 is able to be applied to control of automatic driving by following another vehicle, control of automatic driving for not sticking out from a traffic line, or the like. Furthermore, the imaging system 1000 is able to be applied not only to a vehicle such as an own vehicle but also to a moving body (moving device), for example, such as a vessel, an aircraft, or an industrial robot. In addition, without limitation to the moving body, the imaging system 1000 is able to be applied to equipment such as intelligent Transport Systems (ITS), which uses object recognition widely.

Note that, any of the aforementioned exemplary embodiments is merely an example of specifications for carrying out the disclosure, and the technical scope of the disclosure should not be interpreted in a limited manner by them. That is, the disclosure may be carried out in various forms without departing from technical idea thereof or main feature thereof. Moreover, the exemplary embodiments described above may be variously combined to be carried out.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application. No. 2016-254361 filed Dec. 27, 2016, which is hereby incorporated by reference herein in its entirety.

What is claimed is:

1. A photoelectric conversion element, comprising: a first photoelectric conversion unit; a second photoelectric conversion unit; and a light guiding unit that is provided above the first photoelectric conversion unit and the second photoelectric conversion unit, wherein on each of a first plane parallel to a light receiving surface of the first photoelectric conversion unit, a second plane parallel to the light receiving surface of the first photoelectric conversion unit and closer to the light receiving surface than the first plane, and a third plane parallel to the light receiving surface of the first photoelectric conversion unit and closer to the light receiving surface than the second plane, the light guiding unit has a first part and a second part which is surrounded by the first part and a refractive index of which is lower than that of the first part, wherein a width of the second part on the first plane is a first length, a width of the second part on the second plane is a second length, a width of the second part on the third plane is a third length, and the second length is shorter than each of the first length and the third length, and wherein a width of the first part on the second plane is greater than a width of the first part on the third plane.

2. A photoelectric conversion element, comprising: a first photoelectric conversion unit; a second photoelectric conversion unit; and a light guiding unit that is provided above the first photoelectric conversion unit and the second photoelectric conversion unit, wherein on each of a first plane parallel to a light receiving surface of the first photoelectric conversion unit, a second plane parallel to the light receiving surface of the first photoelectric conversion unit and closer to the light receiving surface than the first plane, and a third plane parallel to the light receiving surface of the first photoelectric conversion unit and closer to the light receiving surface than the second plane the light guiding unit has a first part and a second part which is surrounded by the first part, wherein both the first part and the second part mainly include silicon and nitrogen, and density of silicon and nitrogen is lower in the second part than in the first part, wherein a width of the second part on the first plane is a first length, the width of the second part on the second plane is a second length, the width of the second part on the third plane is a third length, the second length is shorter than each of the first length and the third length, and wherein a width of the first part on the second plane is greater than a width of the first part on the third plane.

3. The photoelectric conversion element according to claim 2, wherein a width of the first part on the first plane is a fourth length, the width of the first part on the second plane is a fifth length, the width of the first part on the third plane is a sixth length, and the fifth length is longer than each of the fourth length and the sixth length.

4. The photoelectric conversion element according to claim 2, wherein a width of the second part, which is parallel to the light receiving surface of the first photoelectric conversion unit, simply decreases from the first plane to the second plane, and the width of the second part, which is parallel to the light receiving surface of the first photoelectric conversion unit, simply increases from the second plane to the third plane.

5. The photoelectric conversion element according to claim 2, wherein the first length is equal to or more than the third length.

6. The photoelectric conversion element according to claim 2, wherein the third length is longer than the first length.

7. The photoelectric conversion element according to claim 2, further comprising a plurality of interlayer films, wherein the first plane is positioned at a position of an interlayer film that is positioned closest to an incident surface side among the plurality of interlayer films.

8. The photoelectric conversion element according to claim 1, wherein both the first part and the second part mainly include silicon and nitrogen, and a ratio of silicon to nitrogen is lower in the second part than in the first part.

9. The photoelectric conversion element according to claim 1, wherein both the first part and the second part mainly include silicon and nitrogen, and density of silicon and nitrogen is lower in the second part than in the first part.

10. The photoelectric conversion element according to claim 2, further comprising an electric charge accumulating unit that accumulates at least an electric charge of the first photoelectric conversion unit, wherein the third plane incudes a first region and a second region that is closer to the electric charge accumulating unit than the first region, and a length of the first part in the second region in a first direction that is a direction from the first photoelectric conversion unit to the electric charge accumulating unit is shorter than a length of the first part in the first region in a second direction that intersects with the first direction in plan view.

11. The photoelectric conversion element according to claim 1, wherein the second part includes Ar more than the first part.

12. A photoelectric conversion element, comprising: a first photoelectric conversion unit; a second photoelectric conversion unit; and a light guiding unit that is provided above the first photoelectric conversion unit and the second photoelectric conversion unit, wherein on each of a first plane parallel to a light receiving surface of the first photoelectric conversion unit, a second plane parallel to the light receiving surface of the first photoelectric conversion unit and closer to the light receiving surface than the first plane, and a third plane parallel to the light receiving surface of the first photoelectric conversion unit and closer to the light receiving surface than the second plane, the light guiding unit has a first part and a second part which is surrounded by the first part, wherein both the first part and the second part mainly include silicon and nitrogen, and the second part includes Ar more than the first part, wherein a width of the second part on the first plane is a first length, the width of the second part on the second plane is a second length, the width of the second part on the third plane is a third length, and the second length is shorter than each of the first length and the third length, and wherein a width of the first part on the second plane is greater than a width of the first part on the third plane.

13. An imaging system, comprising: the photoelectric conversion element according to claim 2; and a signal processing unit that generates an image by using a signal output by the photoelectric conversion element.

14. A moving body, comprising: the photoelectric conversion element according to claim 2; a distance information acquiring unit configured to acquire distance information to a target object on a basis of a signal from the photoelectric conversion element; and a control unit configured to control the moving body on a basis of the distance information.

15. A photoelectric conversion element, comprising: a photoelectric conversion unit; a holding capacitor (Cp2); a light shielding unit (129); and
a light guiding unit that is provided above the photoelectric conversion unit, wherein on each of a first plane parallel to a light receiving surface of the photoelectric conversion unit, a second plane parallel to the light receiving surface of the photoelectric conversion unit and closer to the light receiving surface than the first plane, and a third plane parallel to the light receiving surface of the photoelectric conversion unit and closer to the light receiving surface than the second plane, the light guiding unit has a first part, and a second part which is surrounded by the first part and a refractive index of which is lower than that of the first part, wherein a width of the second part on the first plane is a first length, a width of the second part on the second plane is a second length, a width of the second part on the third plane is a third length, and the second length is shorter than each of the first length and the third length, and wherein a width of the first part on the second plane is greater than a width of the first part on the third plane.

16. A photoelectric conversion element, comprising: a photoelectric conversion unit; a holding capacitor (Cp2); a light shielding unit (129); and a light guiding unit that is provided above the photoelectric conversion unit, wherein on each of a first plane parallel to a light receiving surface of the photoelectric conversion unit, a second plane parallel to the light receiving surface of the photoelectric conversion unit and closer to the light receiving surface than the first plane, and a third plane parallel to the light receiving surface of the photoelectric conversion unit and closer to the light receiving surface than the second plane, the light guiding unit has a first part and a second part which is surrounded by the first part, wherein both the first part and the second part mainly include silicon and nitrogen, and density of silicon and nitrogen is lower in the second part than in the first part, wherein a width of the second part on the first plane is a first length, the width of the second part on the second plane is a second length, the width of the second part on the third plane is a third length, and the second length is shorter than each of the first length and the third length, and wherein a width of the first part on the second plane is greater than a width of the first part on the third plane.

17. A photoelectric conversion element, comprising:
a photoelectric conversion unit; a holding capacitor (Cp2); a light shielding unit (129); and
a light guiding unit that is provided above the photoelectric conversion unit, wherein on each of a first plane parallel to a light receiving surface of the photoelectric conversion unit, a second plane parallel to the light receiving surface of the photoelectric conversion unit and closer to the light receiving surface than the first plane, and a third plane parallel to the light receiving surface of the photoelectric conversion unit and closer to the light receiving surface than the second plane, the light guiding unit has a first part and a second part which is surrounded by the first part, wherein both the first part and the second part mainly include silicon and nitrogen, and the second part includes Ar more than the first part, wherein a width of the second part on the first plane is a first length, the width of the second part on the second plane is a second length, the width of the second part on the third plane is a third length, and the second length is shorter than each of the first length and the third length, and wherein a width of the first part on the second plane is greater than a width of the first part on the third plane.

18. An imaging system, comprising: the photoelectric conversion element according to claim 16; and a signal processing unit that generates an image by using a signal output by the photoelectric conversion element.

19. A moving body, comprising: the photoelectric conversion element according to claim 16; a distance information acquiring unit configured to acquire distance information to a target object on a basis of a signal from the photoelectric conversion element; and a control unit configured to control the moving body on a basis of the distance information.

* * * * *